US009250283B2

United States Patent
Johnson et al.

(10) Patent No.: US 9,250,283 B2
(45) Date of Patent: Feb. 2, 2016

(54) SYSTEM AND METHOD FOR AUTOMATED TESTING OF AN ELECTRIC CABLE HARNESS

(75) Inventors: Darrell J Johnson, La Mesa, CA (US); John C McCosh, San Diego, CA (US); Sara Marmolejo, Austin, TX (US)

(73) Assignee: Psiber Data Systems, Inc, San Diego, CA (US)

( * ) Notice: Subject to any disclaimer, the term of this patent is extended or adjusted under 35 U.S.C. 154(b) by 174 days.

(21) Appl. No.: 13/525,333

(22) Filed: Jun. 17, 2012

(65) Prior Publication Data

US 2013/0162262 A1 Jun. 27, 2013

Related U.S. Application Data

(60) Provisional application No. 61/498,054, filed on Jun. 17, 2011.

(51) Int. Cl.
*G01R 31/00* (2006.01)
*G01R 31/04* (2006.01)
*G01R 31/11* (2006.01)
*G01R 31/02* (2006.01)

(52) U.S. Cl.
CPC .............. *G01R 31/021* (2013.01); *G01R 31/11* (2013.01)

(58) Field of Classification Search
CPC ......... G01R 31/00; G01R 31/04; G01R 31/11
USPC ......... 324/533, 534, 539, 540, 503, 541, 508, 324/424, 713, 522, 601, 536, 66, 628, 324/754.07; 701/45; 702/85, 109; 700/83; 280/735, 736, 738, 801.1
See application file for complete search history.

(56) References Cited

U.S. PATENT DOCUMENTS

| 5,798,647 | A * | 8/1998 | Martin et al. | 324/503 |
| 6,612,021 | B1 * | 9/2003 | Taniguchi et al. | 29/748 |
| 7,605,594 | B2 * | 10/2009 | Blades | 324/713 |
| 2004/0232919 | A1 * | 11/2004 | Lacey | 324/533 |
| 2007/0001683 | A1 * | 1/2007 | Krigel | 324/503 |
| 2007/0152677 | A1 * | 7/2007 | Barsumian et al. | 324/533 |
| 2010/0268507 | A1 * | 10/2010 | Sorensen | 702/120 |
| 2011/0304340 | A1 * | 12/2011 | Hall et al. | 324/533 |

* cited by examiner

*Primary Examiner* — Tung X Nguyen
*Assistant Examiner* — Neel Shah

(57) ABSTRACT

Briefly, a method and system for testing a cable harness is disclosed. Generally, a cable harness is used to route many electric wires for power, communication, and control. The tester includes a switch system that enables one or more TDR engines to sequentially apply a TDR stimulus to substantially all the wire pairs in the cable harness, and to collect the resulting TDR waveforms. The waveforms are analyzed to determine if the cable harness meets quality standards. In some cases the tester may also perform a continuity, resistance, capacitance, or inductance test on the cable harness. The tester may also measure and use temperature in analyzing the cable harness, or may apply temperature cycling, different or varying atmospheric pressures, vibration, shaking, or shock to the cable harness.

19 Claims, 17 Drawing Sheets

SIMPLIFIED TIME DOMAIN REFLECTOMETER

SIMPLIFIED TIME DOMAIN REFLECTOMETER WAVEFORMS

DETAILED TIME DOMAIN REFLECTOMETER

DETERMINING CABLE CHARACTERISTIC IMPEDANCE

← 175

DETERMINING CABLE TERMINATION IMPEDANCE

← 180

IDENTIFYING CABLE DISCONTINUITIES

← 185

_375_

READ BACK DATA

| HARNESS PIN PULLED LOW | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|
| 1 | 0 | 1 | 1 | 1 | 1 | 1 | 1 | 1 | 1 | 1 | 1 | 1 | 1 | 1 | 1 | 1 |
| 2 | 1 | 0 | 1 | 1 | 1 | 1 | 1 | 1 | 1 | 1 | 1 | 1 | 1 | 1 | 1 | 1 |
| 3 | 1 | 1 | 0 | 1 | 1 | 1 | 1 | 1 | 1 | 1 | 1 | 1 | 1 | 1 | 1 | 1 |
| 4 | 1 | 1 | 1 | 0 | 0 | 1 | 1 | 1 | 1 | 1 | 1 | 1 | 1 | 1 | 1 | 1 |
| 5 | 1 | 1 | 1 | 0 | 0 | 1 | 1 | 1 | 1 | 1 | 1 | 1 | 1 | 1 | 1 | 1 |
| 6 | 1 | 1 | 1 | 1 | 1 | 0 | 1 | 1 | 1 | 1 | 0 | 1 | 1 | 1 | 1 | 1 |
| 7 | 1 | 1 | 1 | 1 | 1 | 1 | 0 | 1 | 1 | 1 | 1 | 1 | 1 | 1 | 1 | 1 |
| 8 | 1 | 1 | 1 | 1 | 1 | 1 | 1 | 0 | 1 | 1 | 1 | 1 | 1 | 1 | 1 | 1 |
| 9 | 1 | 1 | 1 | 1 | 1 | 1 | 1 | 1 | 0 | 1 | 1 | 1 | 1 | 1 | 1 | 1 |
| 10 | 1 | 1 | 1 | 1 | 1 | 1 | 1 | 1 | 0 | 1 | 1 | 1 | 1 | 1 | 1 | 1 |
| 11 | 1 | 1 | 1 | 1 | 1 | 0 | 1 | 1 | 1 | 1 | 0 | 1 | 1 | 1 | 1 | 1 |
| 12 | 1 | 1 | 1 | 1 | 1 | 1 | 1 | 1 | 1 | 1 | 1 | 0 | 0 | 0 | 1 | 1 |
| 13 | 1 | 1 | 1 | 1 | 1 | 1 | 1 | 1 | 1 | 1 | 1 | 0 | 0 | 0 | 1 | 1 |
| 14 | 1 | 1 | 1 | 1 | 1 | 1 | 1 | 1 | 1 | 1 | 1 | 0 | 0 | 0 | 1 | 1 |
| 15 | 1 | 1 | 1 | 1 | 1 | 1 | 1 | 1 | 1 | 1 | 1 | 1 | 1 | 1 | 0 | 0 |
| 16 | 1 | 1 | 1 | 1 | 1 | 1 | 1 | 1 | 1 | 1 | 1 | 1 | 1 | 1 | 0 | 0 |

FIG. 8

SYSTEM AND METHOD FOR AUTOMATED TESTING OF AN ELECTRIC CABLE HARNESS

RELATED APPLICATIONS

This application claims priority to U.S. patent application No. 61/498,054, filed Jun. 17, 2011, and entitled "Cable Assembly Test System," which is incorporated herein as if set forth in its entirety.

FIELD OF THE INVENTION

The invention relates generally to a system and method for performing electronic testing on a set of electric cables. In one embodiment, the invention provides a testing platform for automated quality testing of a complex electric wire harness assembly.

BACKGROUND

Modern products have become increasing sophisticated, requiring complex electrical interconnections to provide power, control, and monitoring functionality to various assemblies and components within the product. For example, motor vehicles, such as passenger cars, often have scores of embedded computers to provide monitoring and control for operation, safety, convenience, information, entertainment, and emission control purposes. These processors need to be connected to the assembly that they monitor or control, and usually need to interconnect to some central display or control facility. Also, a vehicle is loaded with scores of electronic devices, such as a radio, electric seats, power windows, entertainment systems, navigation, emission and safety monitors, lighting, cameras, and many other devices currently used and even more importantly for future devices that will rely on higher speed data communication formats. All of these require power, and most need connection to buttons, switches, other devices, a computer, or operator display. In all, hundreds and hundreds of electrical and communication lines run throughout the vehicle. It is critical for operation, safety, emission control, and comfort that these lines provide for a robust and confident electrical and communication connection. Failure of the electrical or communication connections can lead to failure of the vehicle, unsafe conditions, customer dissatisfaction, and expensive and complex warranty repairs. In another example, wiring harnesses are also used in aircraft, spacecraft, marine and agricultural products and vehicles as well as machinery, appliances, instrumentation and electronic devices and systems.

To provide for ease of assembly and increased protection of the electrical lines, the lines are often routed around the vehicle in a multi-circuit wire bundle. This wire or cable assembly, often referred to as a harness, comprises wires and connectors that may be constructed using various types of machinery or built by hand. Then, at a later time in the manufacturing process, the harness is assembled into a final product. For example, FIG. 2 shows a relatively simple cable harness for a modern passenger vehicle, which will be discussed in detail later.

Manufacturing requirements for these cable assemblies may reference industry standards (such as SAE) or may have contractual specifications that must be verified. Many cable assembly manufacturers use a simple continuity test and in some cases a DC resistance measurement to determine that a cable assembly has been manufactured correctly. Continuity tests and DC resistance measurements are limited in detection capabilities to catastrophic faults such as opens and shorts but do not verify that industry or contract required construction standards have been met. Current verification methods often require destructive testing of the assembly to allow physical measurement and visual inspection. Destructive testing is conducted only on a sample basis meaning that large numbers of cable assemblies are shipped to customers with only a limited test that is not capable of detecting manufacturing defects such as improper crimp height, missing wire strands or insulation in the connector pin crimp, insulation cuts or chafes and broken wire strands.

Typical cable assembly testing consists of a continuity test between connectors that shows that the wire has an electrical connection to the correct pins on the connectors. This type of testing does not provide any measurement information that can be used to determine the conformance and quality of the assembly. Other measurement techniques could be used to better identify the electrical properties of the cable assembly to verify the quality of the materials and construction. One technique is to use Time Domain Reflectometry (TDR) to measure the impedance of the assembly along its length. Measurements of the previously listed cable defects have shown that a Time Domain Reflectometer (TDR) would require a few milli-ohms of impedance resolution and a length resolution of 0.25 inches or better for successful defect detection. TDRs with this type of performance typically cost $100,000 or more and are limited to testing one wire pair at a time. Large harness assemblies can have hundreds of wire pairs requiring hours of test time with a standard TDR, and therefore TDR has not been a practical option for harness manufacturers.

The substantial limitations in current cable testing procedures and devices leads to two different and very undesirable consequences. First, cable harnesses are shipped to assembly facilities with an existing undetected defect, and the defect is not discovered until sometime later in the assembly process. This causes unnecessary delay and disruption to fast-moving modern manufacturing processes, leading to down-time and increased manufacturing costs. For example, an assembly plant may assemble an entire vehicle, and then discover in final test that some electrical failure exists because of a faulty cable harness. Second, and even worse, the cable assembly might pass all the factory tests, but then one or more electrical lines fail soon after delivery to a customer. Still worse, such latent wiring defects are often intermittent, making it harder, more expensive, and more frustrating to identify the problem. This leads to potential safety issues, customer dissatisfaction, and a potentially expensive and time-consuming warranty repair. Since the cable harnesses are such a central part of a vehicle, having to replace one can often only be done with a major removal or disassembly of instrument panels, engine components, seats, carpeting or body panels. It has been estimated that almost 25% of warranty claims are related to these later discovered wiring defects, and these claims are individually relatively expensive.

TECHNOLOGY BACKGROUND

A well-known technique for measuring the length (or the distance to a fault) of a cable or wire pair is Time Domain Reflectometry ("TDR"). In this technique, a voltage pulse or step is launched into the cable or wire pair. The pulse or step travels down the wire pair, carried in the electromagnetic field between the wire pair, and bounces off of a major discontinuity, such as an open or a short, and is reflected back to the TDR device. The TDR precisely measures the reflected pulse amplitude and round trip time producing waveform data that represents time verses impedance. Thus, for every pair of wires tested with TDR, the resulting waveform data can be collected. The time measurement is converted into a distance using the cable's Nominal Velocity of Propagation, or NVP factor. NVP is the fraction of the speed of light at which the pulse propagates down the cable. The TDR technology will be described in detail with reference to FIG. 1. A simplified TDR driving an open ended cable is shown in diagram 5.

The launch pulse or step generator produces a pulse or step of amplitude V (waveform "A" in diagram 10) which is applied to the cable under test via the source impedance $R_{SOURCE}$. The source impedance along with the cable under test's characteristic impedance, $Z_{CABLE}$, form a voltage divider producing waveform "B" in diagram 10. Initially, the voltage on the cable under test rises to a fraction of the launch pulse or step amplitude, V, as determined by the ratio of $R_{SOURCE}$ to $Z_{CABLE}$.

$$V_{INITIAL} = V * R_{SOURCE} * Z_{CABLE} / (R_{SOURCE} + Z_{CABLE})$$

Once the launch pulse or step travels down the cable and returns, the voltage on the cable rises to the launch pulse amplitude, V. The TDR precisely measures the launch pulse round trip time, $T_D$, to calculate the length of the cable under test.

The length of the cable is related to this time delay by the following relationship:

$$L_{CABLE} = \frac{T_D * C * K * NVP}{2}$$

Where:
$L_{CABLE}$ is the length in feet.
$T_D$ is the time delay in seconds.
C is the speed of light in a vacuum, $3*10^8$ meters/second.
K is the feet to meters conversion factor, 3.281 feet/meter.
NVP is the cable Velocity of propagation factor.

The two (2) in the denominator of the equation accounts for $T_D$ being the round trip, or down and back, time delay of the cable. The propagation velocity factor, NVP, varies with cable and connector type and is typically about 0.70 but may range from about 0.40 to 0.90. Diagram 15 shows a more detailed look at the basic TDR circuitry. A voltage comparator and flip-flop are used to extract the round trip time, $T_D$, from the cable under test. The "Q" output of the flip-flop is set to a logic 1 on the rising edge of the launch pulse. When the voltage on the cable under test exceeds $V_{TH}$, the Voltage comparator resets the "Q" output of the flip-flop to a logic 0. The flip-flop output is a pulse whose width is equal to the cable's round trip time, $T_D$. The detailed TDR waveforms are shown in diagram 20.

The characteristic impedance, $Z_{CABLE}$, of the cable is usually unknown. This means that the initial voltage on the cable under test rises to an un-known value. The voltage comparator's threshold voltage, $V_{TH}$, must be made variable to allow for the un-known cable impedance. A digital to analog converter, DAC, is used to provide a variable $V_{TH}$ under control of a firmware search algorithm to set an optimum value of $V_{TH}$ to obtain accurate cable length measurements independent of the cable's characteristic impedance, within limits.

A useful cable length measuring tool for some applications might allow for NVP's ranging from 0.40 to 0.99 and measure lengths ranging from 1 foot to 3000 feet with 1 foot resolution. By re-arranging the cable length equation and plugging in the above length and NVP requirements the required range of time delay measurement range can be determined.

$$T_D = \frac{2 * L_{CABLE}}{C * K * NVP}$$

3000 Feet of 0.40 NVP cable has a $T_D$=15.239 micro seconds
1 Foot of 0.99 NVP cable has a $T_D$=2.052 nano seconds The time period measuring system needs to measure time periods ranging from 2.05 nano seconds to >15 micro seconds with a time resolution of <50 pico seconds. One of the most straight forward and simplest techniques for measuring time periods is to gate a reference clock with the $T_D$ signal and count the number of reference clocks occurring during the time that the $T_D$ signal is asserted. The $T_D$ measurement block diagram is shown in diagram 25.

The counter length requirement is calculated:

$N_{COUNT}$=15.239 micro seconds÷50 pico seconds=304780 counts or 19 bits ($2^{19}$=524288)

The 19 bit counter would need to be clocked with a reference clock period of 50 pico seconds or 20 GHz. A 19 bit counter operating at 20 GHz is impractical if not impossible. The technique of time period averaging allows the reduction of both counter length and reference clock frequency. By making many (thousands) of low resolution measurements and averaging the results, the effective time period measurement resolution is increased by a factor equal to the number of measurements. Please note that for this technique to work, the input pulse width to be measured, $T_D$, must be unrelated to the reference clock frequency. This can be accomplished by using two separate oscillators to generate the reference clock and the TDR Launch Pulse.

In one example, the counter length is set to 8 bits, 256 counts. An 8-bit counter is a convenient length for interfacing to an 8-bit microcontroller (microprocessor), but other counter lengths can be used equally as well. The reference clock frequency is now selected so that the 8-bit counter does not overflow during the desired measurement period, Td.

$$F_{REF}\max = \frac{256}{15.239 \text{ micro seconds}} = 16.8 \text{ MHz}$$

Proper design practice dictates that the time period measurement system allow for time periods greater than the calculated maximum of 15.239 micro seconds. Also 16.8 MHz is not a readily available frequency. If the reference frequency is reduced to 10 MHz, a more common frequency, the time period measurement system can measure a maximum period of 25.6 micro seconds which provides an adequate amount of design margin.

$$T_{MAX} = \frac{256}{10 \text{ MHz}} = 25.6 \text{ micro seconds}$$

The half period of the TDR Launch Pulse is then set to between 15.239 and 25.6 micro seconds to provide adequate time period measurement without overflowing the 8 bit counter. In this example, the TDR launch pulse period is set to 40 micro seconds, 20 micro second half period, but other periods could be used equally. During the 20 micro second Launch pulse half period the counter reaches a maximum count of 200.

$Counts_{MAX}$=20 micro seconds*10 MHz=200

The block diagram of the Time period Averaging System is shown in diagram 30. The rising edge of the TDR launch clock sets the $T_D$ signal to a logic high as described herein. The 8-bit counter starts counting the 10 MHz reference clock. When the $T_D$ signal returns low, the 8-bit counter stops counting and holds its present value. The falling edge of the TDR launch clock informs the microcontroller that the measurement is complete. The microcontroller then reads the 8-Bit counter value and adds it to a firmware accumulator. Once the 8-bit counter has been read, the microcontroller resets the 8-bit counter via the reset signal. This cycle is repeated thousands of times. The microcontroller firmware keeps track of how many measurements have been accumulated. Once the desired number of measurements have been accumulated, the microcontroller can calculate the cable length knowing the NVP of the cable.

As an example, the TDR circuitry is connected to 600 feet of cable with an NVP of 0.70 and calculate the pulse width of the Td signal:

$$T_D = \frac{2 * L_{CABLE}}{C * K * NVP}$$
$$= \frac{2 * 600 \text{ Feet}}{3 * 10^8 * 3.281 * 0.70}$$
$$= 1.74162 \text{ micro seconds}$$

The 10 MHz reference clock provides 100 nano second timing resolution during each measurement. The 8-bit counter will count up to either 17 or 18 counts each measurement depending on the random timing relationship between the TDR launch clock and the 10 MHz reference clock.

$$\frac{1.74162 \text{ micro seconds}}{100 \text{ nano seconds/count}} = 17.4162 \text{ counts}$$

After 10,000 measurements the accumulator will contain a total of 174162 counts with the distribution shown in diagram 35. It is a simple task for the microcontroller to multiply the accumulated counts by a scale factor to provide the cable length in either feet or meters and account for the NVP of the cable. Note that there is a tradeoff between the overall measurement speed and resolution. Higher resolution measurements require a longer measurement interval. The number of individual measurements can be tailored to achieve a desired measurement resolution and or measurement interval.

By using the technique of time period averaging, the counter and reference clock requirements have been greatly reduced. The remaining issue to be addressed is the TDR dead zone. The dead zone is the minimum pulse width or cable length that can be measured. Typical dead zones are in the range of 10 to 20 nano seconds corresponding to three to six feet of cable. The dead zone is the result of the use of non-ideal components in the TDR circuitry. The voltage comparator has a finite, non-zero response time. The flip-flop has a non-zero minimum setup time between the assertion of the Set and Reset inputs. This time delay can be as long as several tens of nano seconds. The time delay of the voltage comparator actually helps reduce the dead zone as this time delay increases the time delay between the assertions of the flip-flop set and reset inputs.

A simple approach to reducing the dead zone is to add a time delay between the TDR circuitry and the cable under test. The time delay can be implemented in several methods. The simplest method is to wind up about 10 feet of cable inside the TDR housing. This time delay can also be accomplished by laying out a long PCB trace between the TDR circuitry and the cable connector. Although these methods are simple they are not very elegant and are susceptible to process and temperature variations and are inefficient in terms of area and or volume.

Rather than adding an analog time delay between the TDR circuitry and the cable under test, a digital time delay can be added between the launch pulse and the set input of the flip-flop, allowing very short time periods, <<1 nano-second, to be measured. This digital time delay can be easily accomplished by replacing the launch clock with a state machine driven from a crystal controlled oscillator. The block diagram of the short time period measurement system is shown in diagram 40.

The 400 KHz oscillator, waveform "E", provides a stable timing reference to the state machine. In this example, the timing reference frequency is 400 KHz but other frequencies can be used equally. The state machine provides two outputs, launch, waveform "A" and sync, waveform "F". The relevant waveforms are shown in diagram 45.

The sync signal is applied to the set input of the flip-flop. The sync signal sets the output of the flip-flop, $T_D$, to a logic high level 2.5 micro seconds before the rising edge of the launch pulse. In this example, the time delay is 2.5 micro seconds but other delay times can be used equally. This large time delay, compared to the setup time of the flip-flop, ensures that the output of the flip-flop accurately tracks the time delay of the cable under test with no metastability issues.

The launch pulse propagates down the cable and bounces off the open at the far end of the cable and returns. When the launch pulse returns, the voltage seen by the positive (+) input voltage comparator, waveform "B", steps up to V. When voltage on the positive (+) input of the comparator exceeds the voltage on the negative (−) input, $V_{TH}$, the output of the comparator switches high, waveform "C". This rising edge clocks the logic low at the D input of the flip-flop to the Q output of the flip-flop returning the $T_D$ signal, waveform "D" low.

The $T_D$ signal is a pulse whose width is directly proportional to the length of the cable plus a 2.5 micro second offset. It is a simple matter for the microcontroller to subtract the 2.5 micro second offset from each measurement to obtain the actual time delay of the cable under test. In practice, the actual amount of offset that is subtracted from each measurement is not exactly 2.5 microseconds due to the non zero time delays of the TDR circuitry. The actual offset value is stored in non-volatile memory as a calibration constant.

The techniques of time period averaging and short time period measurement can be combined to produce an inexpensive high performance time domain reflectometer with no dead zone. The waveforms shown in the above figures are idealized. A real world cable has a return waveform similar to what is shown in diagram 50.

Note that the real world cable return waveform is not pretty. The inflection point where $T_D$ is measured is not well defined. The return waveform is not flat and may also be bumpy leading up to the inflection point, where $T_D$ is measured. The waveform may also slowly rise after the inflection point further complicating the detection of the inflection point. The microcontroller firmware $V_{TH}$ search algorithm must be able to ignore the bumps and lack of flatness on the cable return signal to find the inflection point.

The time period averaging system variable measurement resolution—measurement time feature allows many fast, low resolution measurements to be made allowing the $V_{TH}$ search algorithm to accurately locate the inflection point and set $V_{TH}$ appropriately. Once the correct value of $V_{TH}$ is established, a slow, high resolution time period measurement is made to accurately measure the cable length.

The time period averaging system described in the above paragraphs requires that the TDR launch clock and the time period averaging reference clock be unrelated for proper operation. Depending on the implementation technique used in the design, the time period averaging counter can interfere with the TDR launch clock, producing non-linearities and dead spots in the measurement due to injection locking of the voltage comparator. Non-linearities and dead spots, cable lengths that read zero or close to zero, can occur when the falling edge of the TDR $T_D$ signal is coincident with a major bit transition in the period averaging counter. Major bit transitions occur in a binary counter when the counter advances from 7 to 8, 15 to 16, 31 to 32, 63 to 64, and 127 to 128. When large numbers of bits transition at the same time very large power supply transient currents flow which can corrupt the TDR voltage comparator and related circuitry. Interactions between the TDR and Period Averaging circuitry are especially prevalent if the TDR and period averaging circuitry are combined within a single programmable logic device, PLD or application specific integrated circuit, ASIC. The interaction is due in part to the sharing of power and ground pins between the circuit sections. Overcoming these issues may be done by the use of well-known Gray-code techniques, which are useful for reducing cycle to cycle energy consumption.

Accordingly, although TDR, as well as other test processes, are known to function to characterize electrical wires, these known processes have not been advanced in order to scale to effectively test and characterize the large and complex electrical routing that is used in modern cable harnesses. Instead, automobile manufacturers have accepted cable harnesses that pass current rudimentary tests as described above, and then tolerate the many latent defects, customer dissatisfaction, and warranty expense when a cable harness is installed in a vehicle, and then fails in the hands of a customer.

It is thereby understood that current devices and process for testing cable harness do not sufficiently identify and locate faults, and that there has been no effective way incorporate the use of TDR testing devices for multi-wire harness testing.

SUMMARY

The invention of the present disclosure is directed to a method and system for testing a cable harness. Generally, a cable harness is used to route many electric wires for power, communication, and control. The tester includes a switch that enables one or more TDR engines to sequentially apply a TDR stimulus to substantially all the wire pairs in the cable harness, and to collect the resulting TDR waveform data. The waveform data is analyzed to determine if the cable harness meets quality standards. In some cases the tester may also perform a continuity, resistance, capacitance, or inductance test on the cable harness. The tester may also measure and use temperature in analyzing the cable harness, or may apply temperature cycling, vibration, shaking, atmospheric pressure cycling, or shock to the cable harness.

In one design, the tester is constructed to have a set of TDR engine cards that can be received into a frame. In this way, a large number, for example 24, TDR channels can be used at one time. Each of the TRD channels connects to the switch, which connects each of the TDR channels to a different wire pair in the cable harness. In this way, substantially all the wire pairs in the cable harness can be evaluated using TDR measurement in a highly efficient manner. The switch may use relays or solid state switches for selecting the wire pair for testing. Solid state switches can improve efficiency and increase routing flexibility for selecting a wire pair.

The tester is constructed to fully test and characterize the cable harness, for example, by identify shorts, opens, insulation chafing, wire over-twisting, wire over-stretching, pinches, loopbacks and severed or broken strands within a wire. In one particularly useful aspect, the tester is able to evaluate the quality of a connector terminal crimp, and identify an air gap, over-crimping, under-crimping, missing strands, insulation in the crimp or insufficient crimp length.

The tester can analyze the resulting TDR waveform data using algorithmic processes, or can do an efficient pass/fail determination by comparing the resulting waveform to a measured or calculated standard TDR waveform. The standard TDR waveform is typically generated responsive to testing and characterizing a number of known good cable harnesses or can be calculated based on the type of wire, terminal and connector. Preferably, the standard TDR waveform includes upper and lower test limits useful to determining whether or not to reject the cable harness.

Advantageously, the tester enables an efficient system for performing a quality assurance test on a cable harness. By using the pre-defined test limits based on standard waveforms, and detecting deviations therefrom, the tester is able to identify latent defects that otherwise remain undetected.

BRIEF DESCRIPTION OF THE DRAWINGS

FIG. 8 is a result matrix from the continuity testing circuit of FIG. 7.

DESCRIPTION OF PREFERRED EMBODIMENTS

Figure 1A:
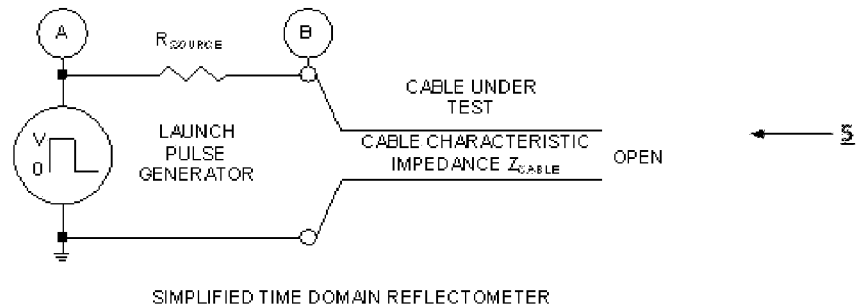
FIG. 1A to FIG. 1C include diagrams generally describing a TDR process and devices.
Figure 1A:
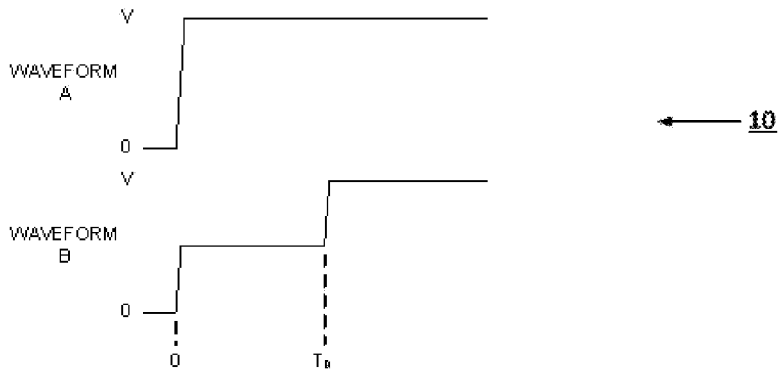
Figure 1A:
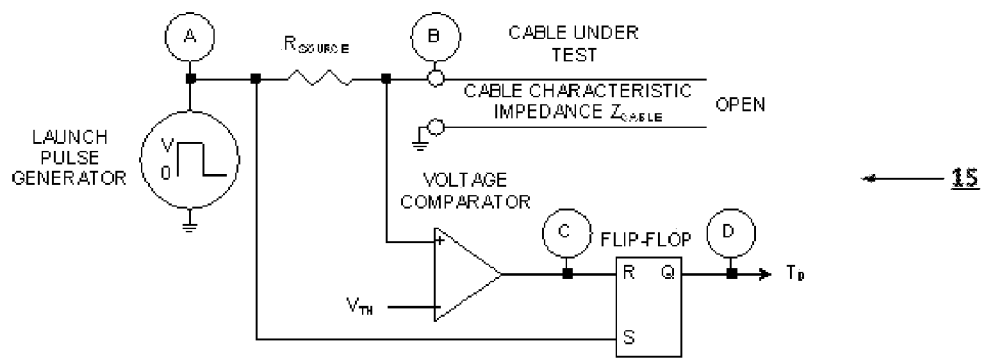
Figure 1B:
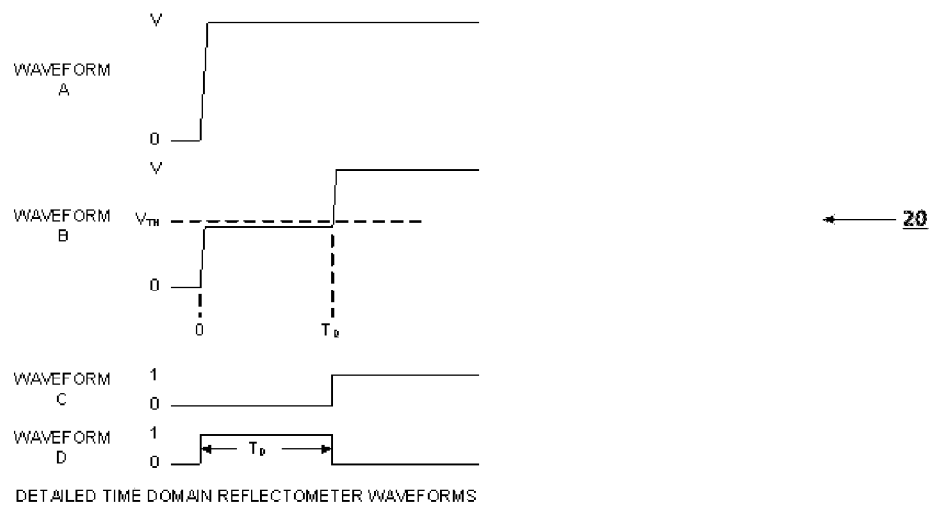
Figure 1B:
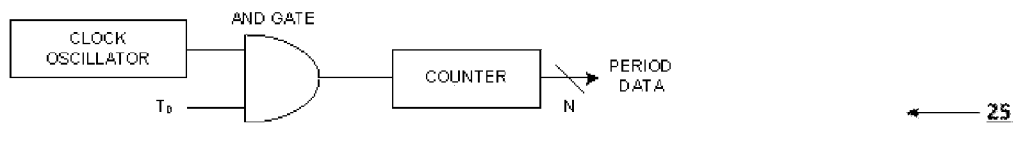
Figure 1B:
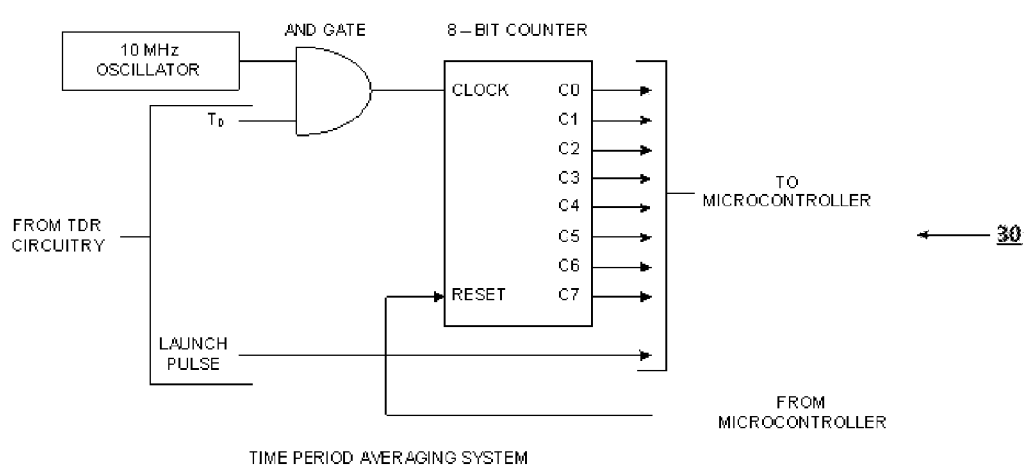
Figure 1C:
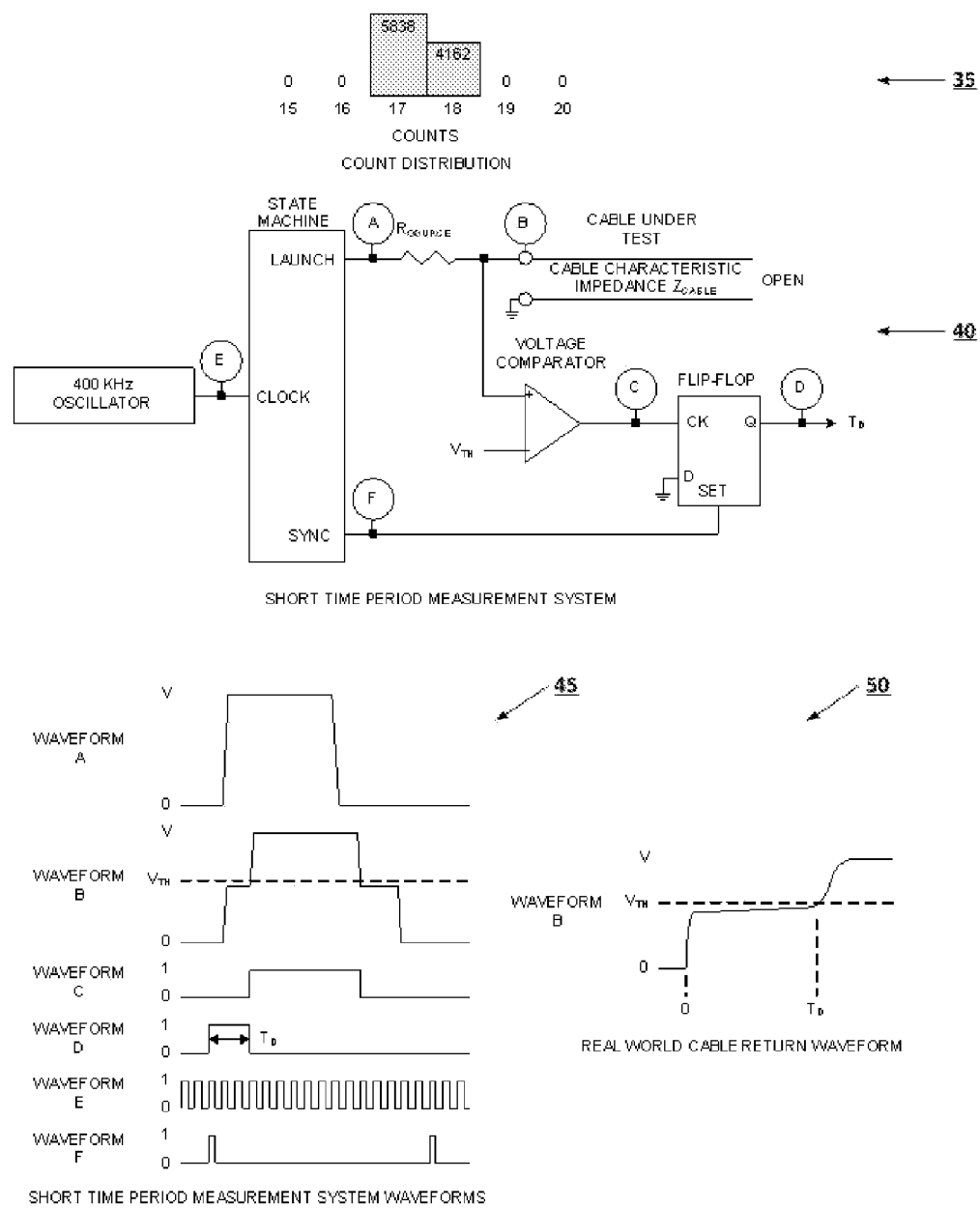
Figure 2:
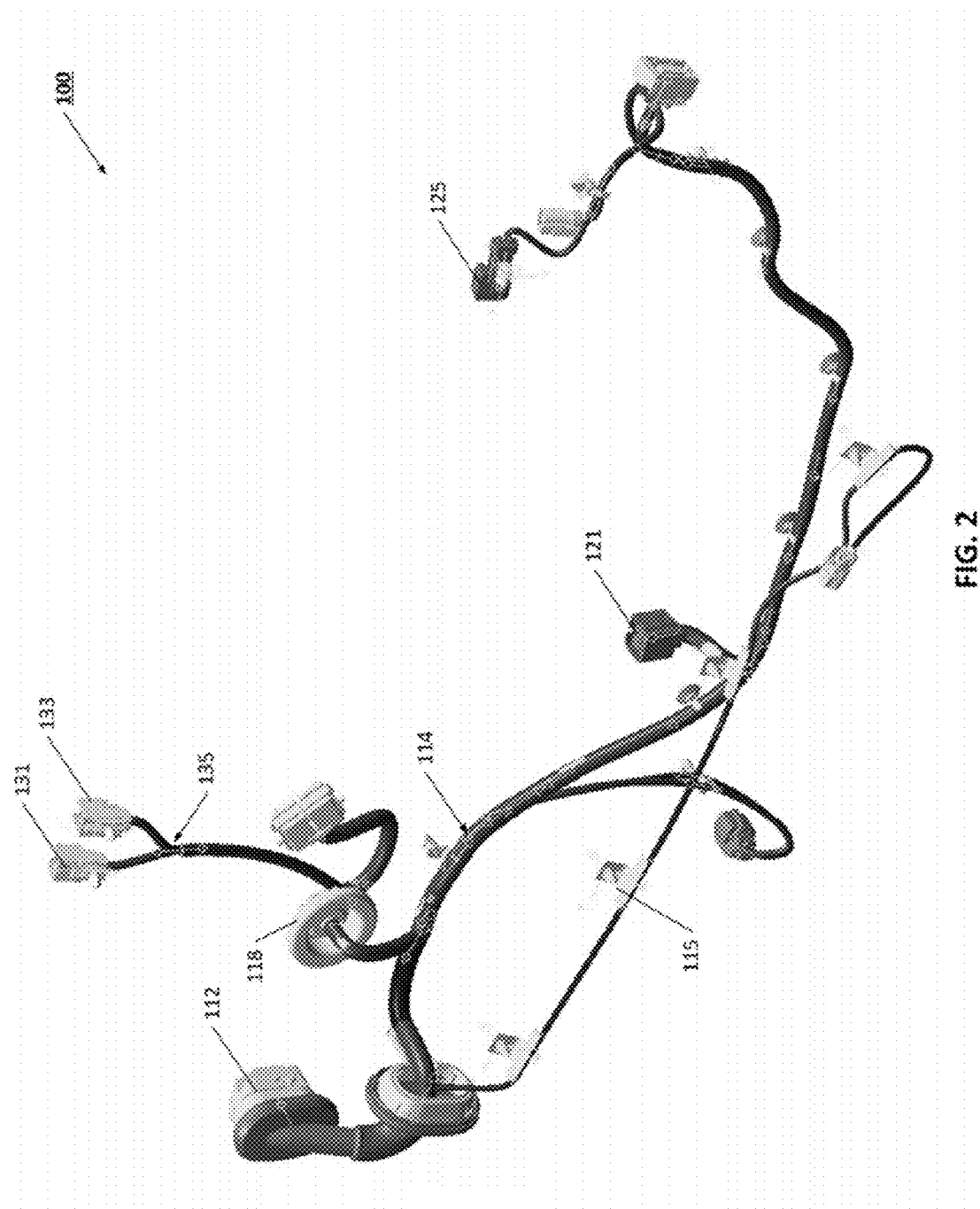
FIG. 2 is a diagram of a wire harness suitable for testing with a harness tester in accord with the present invention.

Referring now to FIG. 2, a typical cable harness is illustrated. In particular, harness 100 is a relatively simple harness for a passenger car, and may be particularly constructed for use in providing electrical and communication interconnection for a single passenger car door. It will be understood that the disclosure of the present invention can be used on many different types and complexities of electrical harnesses, and is applicable on products other than motor vehicles. For example, airplanes, spacecraft, ships and boats, heavy-duty equipment, machinery, appliances, instrumentation, consumer electronics, computers, displays and other electrically powered devices all use cable harnesses to efficiently route electrical, power, and communication lines. It will also be understood that the harness may comprise many different kinds of lines, such as power, digital, analog, and ground, and that these wires come in many sizes and materials, or may be formed as individual wires, wire pairs, twisted wire pairs, or co-axial cables. Additionally, these lines may be incorporated in industry standard cables such as USB, HDMI, Ethernet, Industrial Ethernet, SATA and other.

Harness 100 has many lines, such as power, analog control, power, and ground. It may also have communication lines for connection to a local or central processor. For ease of assembly, harness 100 is constructed with terminating connectors or plugs, such as connectors 112, 121, and 125, for mating with mating connectors in the automobile. It will be understood that other interconnections may be used. To protect harness 100, protective supports, such as support 118, may guide portions of the harness through sharp transitions. Also, guide clips 115 may be used to secure the harness to the automobile structure.

The specific types and routing of the lines within harness 100 are dictated by the specific requirements of the interconnection demands of the target car door. In many cases, the wiring pattern is quite complex. For example, a wire that originates in connector 112 may extend down the length 114 of harness 100 all the way to the end connector 125. Another pin in connector 112 may terminate in a much shorter distance, for example in connector 121. In yet another example, a pin from a given connector may terminate in two or more different pins, and may even be in different connectors, such as a pin in connector 112 may terminate in both a pin in connector 131 and a pin in connector 133. In yet another example, two pins may terminate in a single pin at the other end. Most harnesses, even relatively simple ones, have Y's 135 where one or more lines split off from the main harness path 114, and may have splices, connections, and other routing complexities.

Figure 3:
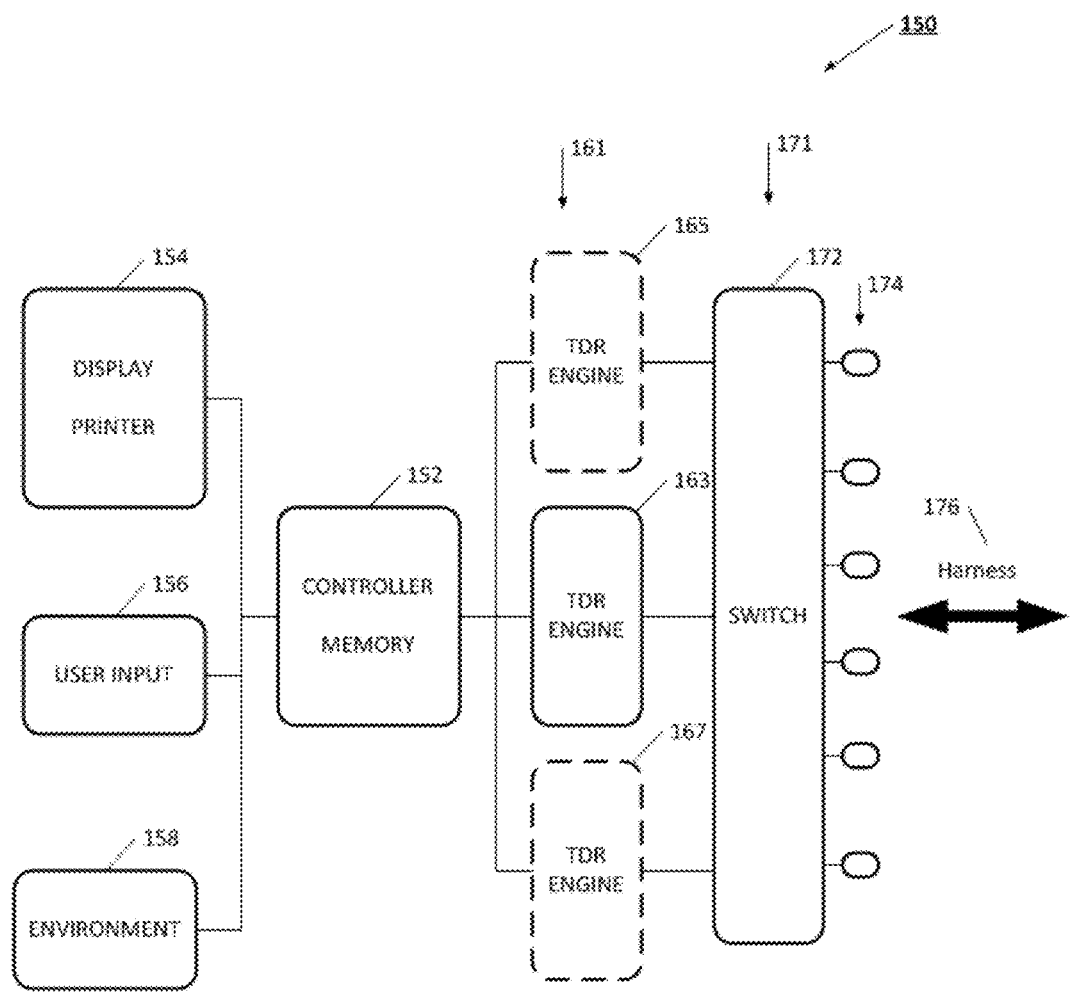
FIG. 3 is a block diagram of a harness tester in accord with the present invention.
Figure 4A:
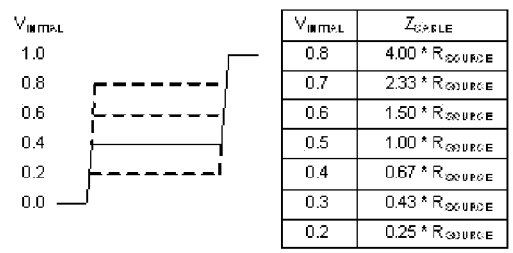
FIG. 4A to FIG. 4C include diagrams generally describing an advanced TDR process for use with a harness tester in accord with the present invention.
Figure 4A:
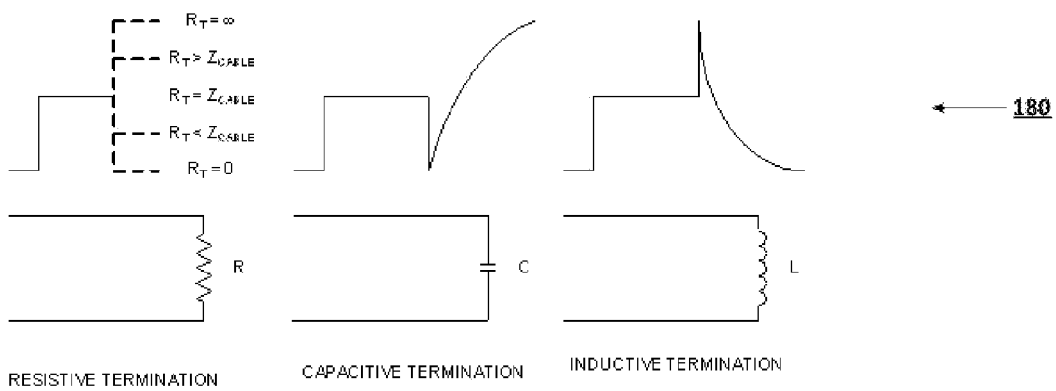
Figure 4A:
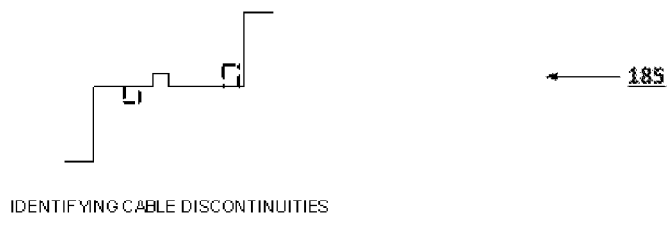
Figure 4B:
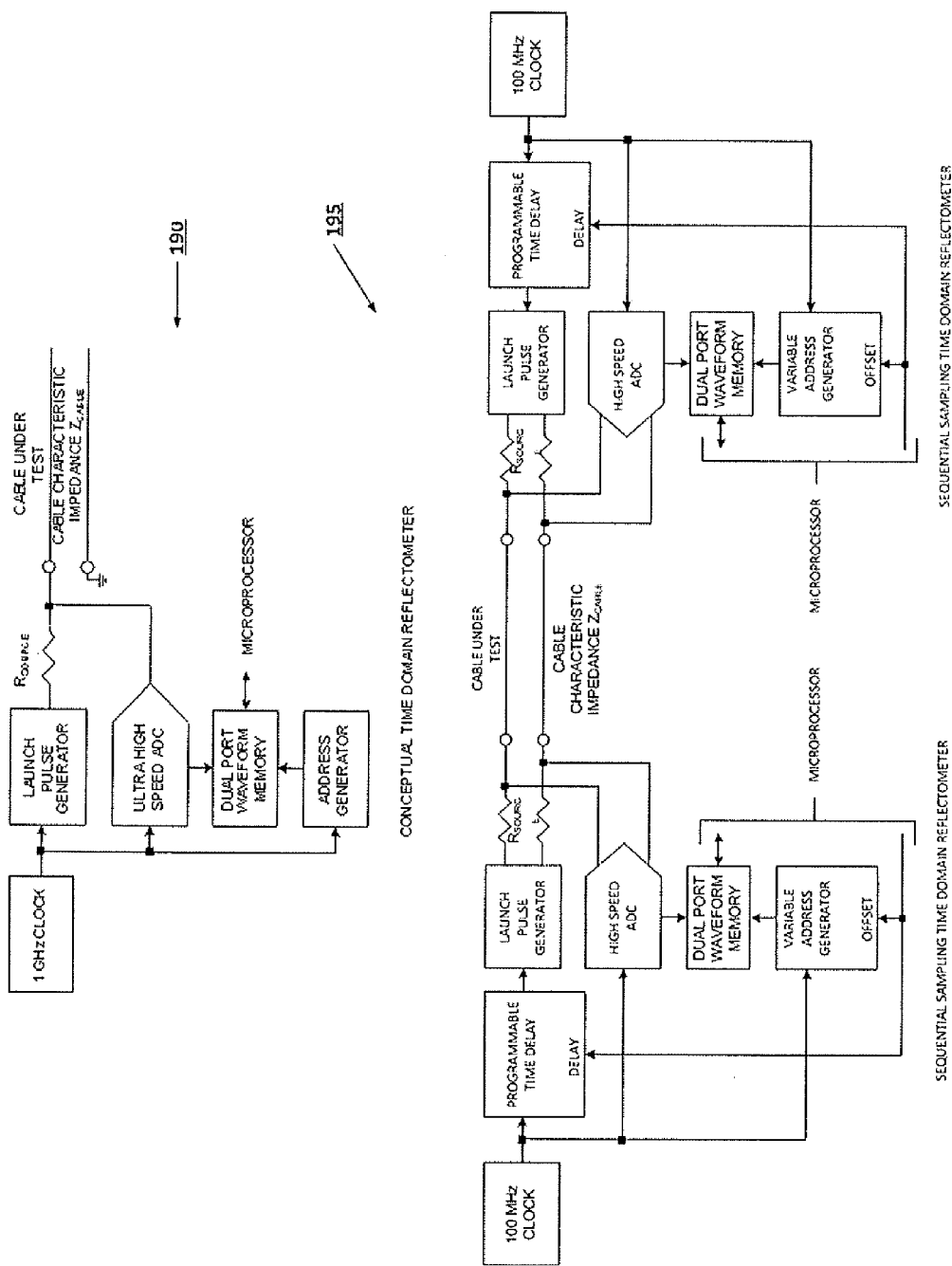
Figure 4C:
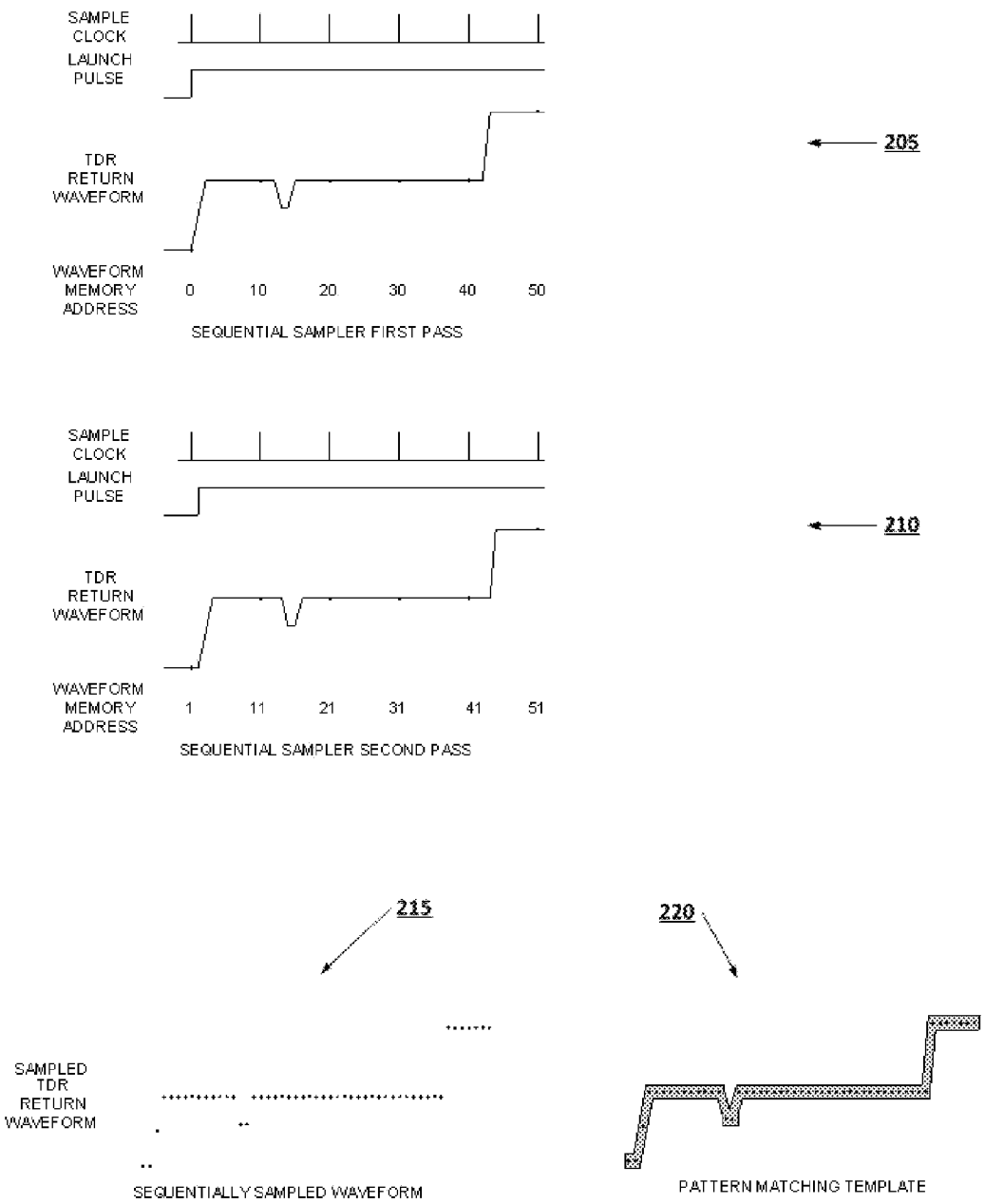

Advantageously, FIG. 3 illustrates an automated harness tester 150 that may be used at the time of assembling the harness to assure that the harness is properly constructed, meets quality guidelines, and is likely not to suffer premature failure from latent defects. Although the described tester 150 is intended for use to support the manufacturing and quality processes, it will be understood that the tester described herein may be used for quality testing during final assembly of the product, during a re-work process to identify and fix defects, in a repair facility to assist a mechanic or technician in locating and troubleshooting an electrical or communication problem or in a development environment for characterizing new terminals, wires, connectors and harness designs.

Tester 150 has a controller or processor 152 that has a computer display 154, a printer, and user inputs 156 such as a keyboard, touch-sensitive display, scanner or mouse. It will be understood that many types of peripheral devices may be used. It will also be understood that processor 152 may be an embedded processor, or may be discrete or provided remotely. Generally, processor 152 acts to manage the overall harness test, accept inputs from the user, and present results of the test. In one option, controller 152 may also have an environmental 158 input or control device. For example, environment device 158 may measure the temperature of the cable assembly, or may operate heaters or coolers to cycle the harness through a temperature range. It has been found that some harness tests are sensitive to temperature, and therefore a more accurate assessment may be made by accounting for temperature in quality comparisons. Also, it is known that some defects may be temperature activated, and by cycling though a range of temperatures to stress the cable, these normally latent defects become detectable. In a similar manner, applying a vibration, shaking, shock, or varying atmospheric pressure may also expose latent, difficult or intermittent defects.

In one embodiment, controller 152 may have a stored test suite for a given cable harness. The test suite has pre-defined all the interconnections that need to be tested, and has target quality results that must be met. Typically, the target quality results will include expected continuity results, target resistances, and upper and lower waveform test limits for each wire pair. Sensors may also be used to verify the presence of clips or retainers used to mount the harness. It will be understood that other electrical or physical targets may be stored. The controller 152 may also provide for storage of results, printing of tags to be attached to the harness, or allow for further analytics by the operator or technician.

In some arrangements, tester 150 may be scalable to handle many different levels of cable harness complexity. Other arrangements may be constructed to handle a more limited range of cable harnesses, or in some cases, may even be made to handle a specific harness. These later arrangements may be more useful for service or remote applications, where the more flexible and expandable arrangements may be more applicable to manufacturing and assembly locations.

Tester 150 has TDR test circuitry 161 that has at least one TDR engine 163, and in many cases will benefit by having several additional TDR engines, such as TDR engines 165 and 167. Since some harnesses can have hundreds of connection terminals, considerable time can be saved by running several TDR tests in parallel. As will be described in more detail later, tester 150 may be configured to apply a TDR test to every connection point in the cable harness. That is, TDR is used to confirm every wire and every crimp connection in a harness. Further, tests may be performed at multiple temperatures, atmospheric pressures and with or without vibration. Accordingly, for any given harness, tester 150 may run thousands of individual TDR tests. The use of many TDR engines can be effectively used to reduce test time, or to take multiple runs to improve accuracy. Indeed, it is contemplated that some moderately complex harnesses could benefit from the use of 24 or more TRD engines operating in parallel.

It will be understood that the harness for use with tester 150 may be similar to harness 100 described earlier, or may be more or less complex. Further, tester 150 is constructed so that the connectors 174 are selected and sized to mate with cooperating connectors on the harness. It will be understood that other types of mating interconnections could be used. For example, connectors 174 may be known body holders which allow for simplified coupling to connectors. A body holder is sized to physically mate with a particular connector, and has pogo pins that provide for robust electrical contact to the individual terminals. Generally, a pogo pin is an electrically conductive pin that has a spring structure for compressing the pin against an associated terminal in the connector. Due to the compression range of the spring, contact can be maintained, even when there are tolerance differences with the connector, for example, due to wear or misalignment. A body holder also typically has latches or some other mechanism to secure the connector into the body holder during the test.

When the harness is properly coupled to connectors 174, every connector of the harness will be attached and electrically coupled to the tester circuitry. In this way, every connection terminal in every connector on the harness is coupled to a pin in one the tester's connectors 174. Since there may be hundreds of connection pins, a switch 171 is used to flexibly connect the harness connections to the available TDR engine 161.

Switch 171 may be provided in any of several constructions. For example, switch 171 may be a single switch 172 or routing device, or multiple switch devices arranged or cascaded together. In another example, switch 171 may be constructed using relays or mechanical switches, and in other cases may use solid state switches, or any combination of relays, mechanical switches and solid state switches.

As described earlier, TDR is a test that is performed on two wires that have a defined, close physical relationship. For a given line in a cable harness 176, another line may be found that is in close proximity to it, at least for a portion of its length. For purposes of the TDR test, these lines form a line pair. In some cases, the line pair may be a twisted pair, in other cases, the line pair may just be two lines that are closely aligned for a particular length. Due to the accuracy and speed needed for tester 150, the TDR engine has been constructed to provide a waveform with 16 bits of vertical resolution (impedance), at a horizontal sampling resolution of 50 picoseconds (distance). It will be understood that more or less vertical or horizontal resolution can be used to satisfy a particular application.

Before proceeding to further describe the overall tester device and process, the TDR engine will be described in more detail with reference to FIG. 4. Besides identifying obvious open or shorts in a line, the TDR return waveform also contains a wealth of information about the impedance of a wire pair over its entire length. More particularly, the precise shape of the TDR return waveform conveys a plethora of information about the wire pair impedance, and what may appear as insignificant impedance variations may indicate the presence of critical latent defects caused by improper assembly or non-conforming materials. In this way, the careful analysis of the waveform for the first time allows identification of wire pairs in cable harnesses that are likely to fail prematurely due to latent defects. The cable's characteristic impedance, $Z_{CABLE}$, can be determined from the height of the initial step, $V_{INITIAL}$, and the TDR's source impedance, $R_{SOURCE}$, as shown in diagram 175.

The impedance of the cable's far end terminal can also be determined from the TDR return waveform as shown in diagram 180. Discontinuities, caused by damage to the cable, poor quality splices, or improper connector installation, along the length of the cable can also be determined from the TDR return waveform as shown in diagram 185. The key technology of a graphical TDR is the waveform capture hardware. The capture hardware takes a snapshot of the high speed waveform and presents it to the microprocessor for display or template comparison. The requirements on the capture hardware are quite stringent, the hardware must make a high fidelity, high resolution recording of sub-nanosecond events quickly and cheaply in terms of cost, PCB area and power consumption without introducing excessive distortion to the captured waveform.

A basic graphical TDR design would be capable of measuring up to 3000 feet of 0.40 NVP cable while maintaining one foot resolution on 0.99 NVP cable.

3000 Feet of 0.40 NVP cable has a $T_D$=15.239 micro seconds

1 Foot of 0.99 NVP cable has a $T_D$=2.052 nano seconds
The capture system should have about 1 nanosecond time resolution to accurately locate discontinuities over the length of the cable. The most obvious approach to capturing the TDR return waveform is an ultra high speed analog to digital converter (ADC) whose digital results are stored in high speed dual port memory. A block diagram of a conceptual graphical TDR is shown in diagram 190.

The 1 GHz clock drives the launch pulse generator, ADC and address generator. The ADC digitizes the TDR return waveform every nanosecond and stores the digital representation in the dual port waveform memory. The address generator sequentially addresses each memory location. When a capture is complete, the microprocessor reads and displays the contents of the waveform memory. The primary design issue is maintaining a very high sample rate, <1 nanosecond, while writing to non-exotic, low cost, 10 nanosecond, or so write cycle waveform memory. The block diagram of the sequential sampling TDR is shown in diagram 195.

The sequential sampling TDR in this example operates with a 100 MHz sample clock and achieves a one ten nanosecond sample rate. The basic technique can be extended to provide faster sample rates while maintaining a reasonable waveform memory write cycle time. A programmable time delay is inserted between the sample clock and launch pulse generator. The time delay can be programmed between zero and nine nanoseconds under control of the microprocessor. The high speed ADC samples the TDR return waveform every 10 nanoseconds. The digitized return waveform is stored in the dual port waveform memory. The variable address generator counts up by tens starting from the offset value programmed by the microprocessor.

The sequential sampling system operates as follows. The microprocessor sets the programmable time delay and the variable address generator offset to zero. The launch pulse generator applies a step to the cable under test and the high speed ADC digitizes the TDR return waveform every 10 nanoseconds. The ADC data is stored into the dual port waveform memory under control of the variable address generator. The variable address generator starts counting from memory address zero by tens, 0, 10, 20, 30 . . . . The sequential sampler's first pass is illustrated in diagram 205.

Once the first pass is complete, the microprocessor sets the programmable time delay and the variable address generator offset to one nanosecond and captures another set of data as illustrated in diagram 210. The above sequential sample process is repeated for delay and offset counts up to nine. The fully sequentially sampled waveform is illustrated in diagram 215. The sequential sampling technology can be extended to provide sub-nanosecond sampling resolution with low power, PCB area, and cost. In this way, it becomes economically feasible to provide many TDR engines for a tester.

The TDR return waveform contains important of information about the quality of the cable or wire pair and its connections. The sequential sampling technology can be combined with pattern matching algorithms to provide a cable imaging TDR with an unambiguous "Pass or Fail" display. The output of the sequential sampling system is an array of data describing the impedance verses length of a cable or wire pair. If a statistically significant number of "good" cables are tested, a template of a "good" cable can be generated. An illustration of a cable template is shown in Figure 220. The TDR cable imaging with pattern matching tester will substantially improve wiring harness quality and reduce troubleshooting time.

Figure 5:
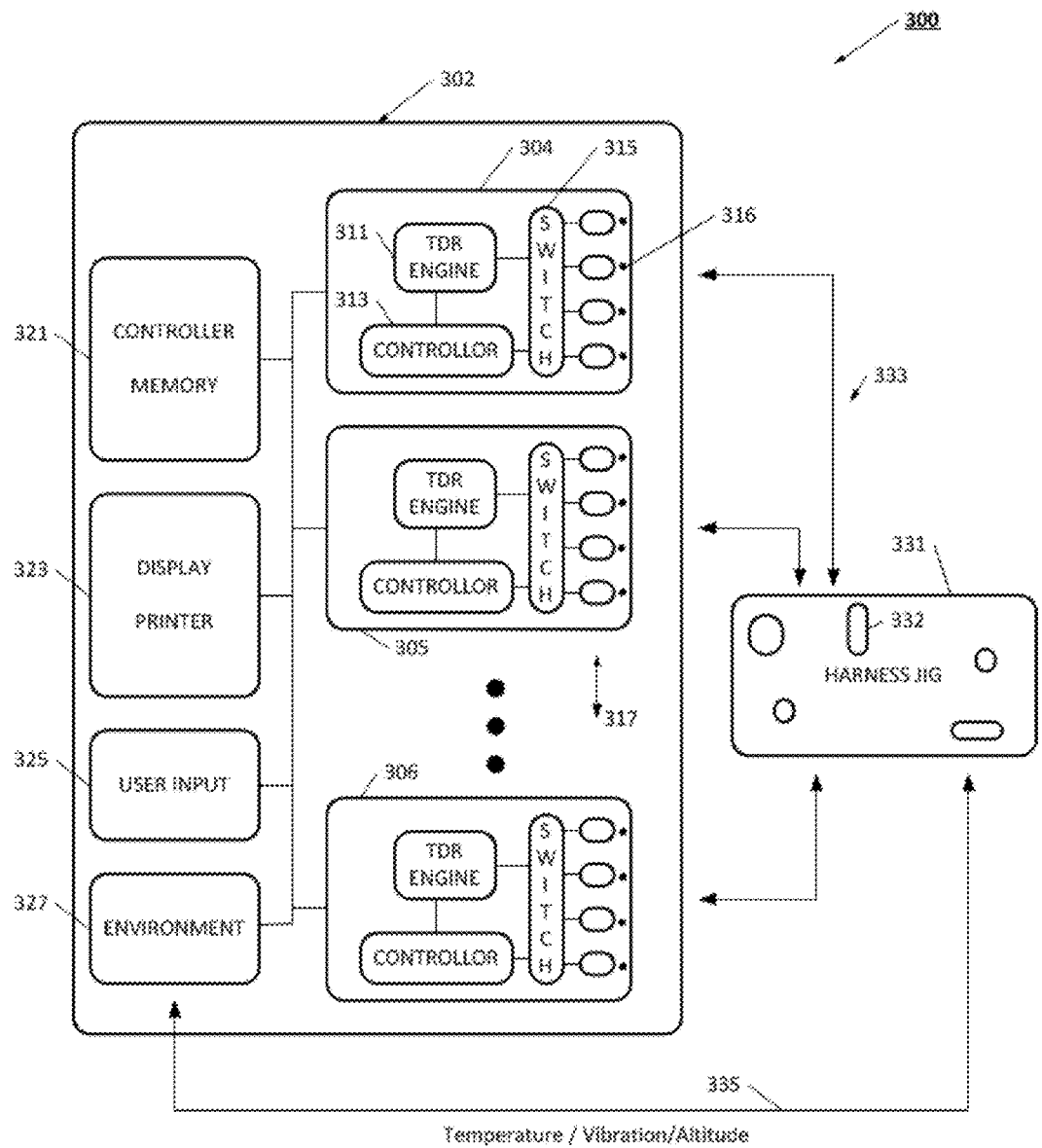
FIG. 5 is a block diagram of a harness tester in accord with the present invention.

Referring now to FIG. 5, another harness tester 300 is illustrated. Tester 300 has many similarities with tester 150, described with reference to FIG. 3, so only the differences will be described in detail. Tester 300 is illustrated as a stand-alone tester in a housing 302. It will be understood that the functionality of tester 300 may be divided into two or more housings, or that certain functions may even be provided using remote communications. Tester 300 has a main processor (controller) and memory 321 that manages the overall test flow, interaction with the operator, and presentation of results. In many cases, tester 300 will have a display 323, printer, and one or more user inputs 325. Tester 300 may also measure or set environmental conditions 327 for the test, such as temperature, vibration, atmospheric pressure, or shock, as described earlier.

Housing 302 is constructed to receive multiple TDR modules, such as TDR modules 304, 305, and 306. It will be understood that more or fewer modules may be used depending on application specific requirements. Each TDR module may be same, or there may be modules designed for specific needs. Also, although the connectors 317 are illustrated as being mounted on the TDR module, it will be appreciated that additional flexibility may be had by allowing different types of body holders or connection types to be substituted. Optionally, each connector 317 has an associated LED 316 that is used to indicate when the harness connector is sufficiently physically inserted into the body holder. That is, when the connector is properly engaged, it activates a switch in the body holder that caused the LED to light green, indicating to the operator that the connector is properly in place. It will be understood that other notification devices and processes could be used.

In one arrangement, the connectors 317 have interconnection lines 333 that couple to a harness jig 331. The harness jig 331 is sized and constructed to hold a specific electrical harness. More specifically, harness jig 331 may have body holders 332 or other selected connectors that receive and electrically connect to the harness connectors. In this way, each pin in each connector in the harness couples to an associated pin in a body holder, which is connected back to connectors 317. Also, harness jig 331 may sense for the presence of harness clips or harness supports, and report back to the tester 300 if any are missing. Even though not part of the electrical makeup of the harness, it is important that a harness have the supports and clips as designed. In one construction, the operator presses each clip or support into a holder in the jig 331, and the jig 331 has a switch that can report the presence of the clip or support.

The TDR modules also have a TDR engine 311 as previously described and a switch 315. The switch may be mechanical, although electronic switches may provide for more flexibility and reliability. In many cases, it will be advantageous that each TDR module have its own controller 313. However, in some cases, the TDR module could use the system controller 321. In other cases, the system 300 could provide cooperation between the controllers on the TDR modules, allowing for a less powerful system controller 323, or even no system controller at all.

Figure 6:
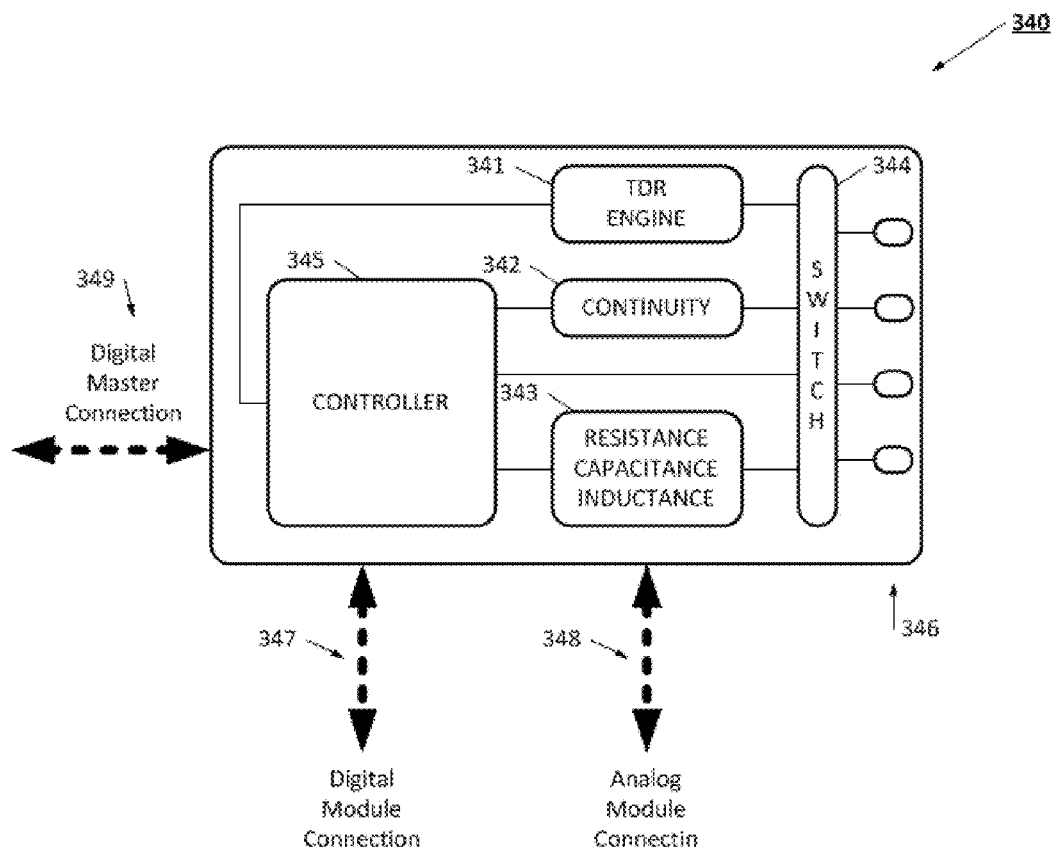
FIG. 6 is a block diagram of a testing module for a harness tester in accord with the present invention.

Referring now to FIG. 6, a harness test module 340 is illustrated. Harness test module 340 is similar to test module 304 described with reference to FIG. 5. Test module 340 has a controller 345 that manages the tests that are run on the module, as well as provides for coordination with the main system controller, other test modules, or both. In one example, test module 340 may have a digital communication connection 347 to other tester modules in the same housing, or may have a digital connection 349 to a main system controller.

As described earlier, test module 340 has a TDR engine 341, switch 344, and connectors 346. Tester module 340 also is constructed to perform other tests useful for evaluating the quality of a cable harness. For example, tester module 340 has a continuity test block 342 for performing a continuity test on the entire cable harness. Advantageously, the continuity test 342 is able to perform a continuity test on every connection in the entire cable harness. As previously discussed, the a cable harness may have a complex interconnection arrangement, with (1) 1 pin terminating in 1 pin; (2) 1 pin terminating in multiple pins; or (3) multiple pins terminating in 1 single pin. In such a complex environment, it is important to confirm that connections have been properly made, and that improperly inserted wires, stray wire strands, missing wires, pushed out terminals or shorts are identified.

Test module 340 also has circuitry 343 for performing resistance, capacitance, or inductance tests. As will be described later, these tests are able to detect if wires are of the wrong gauge, wrong material, or do not have proper twisting. Since these are analog tests that are performed end-to-end, it is possible that one end of a wire may terminate in one test module, and the other end may terminate in another test module. Accordingly, the test module 340 has an analog interconnection 348 that allows analog connectivity between test modules.

Figure 7:
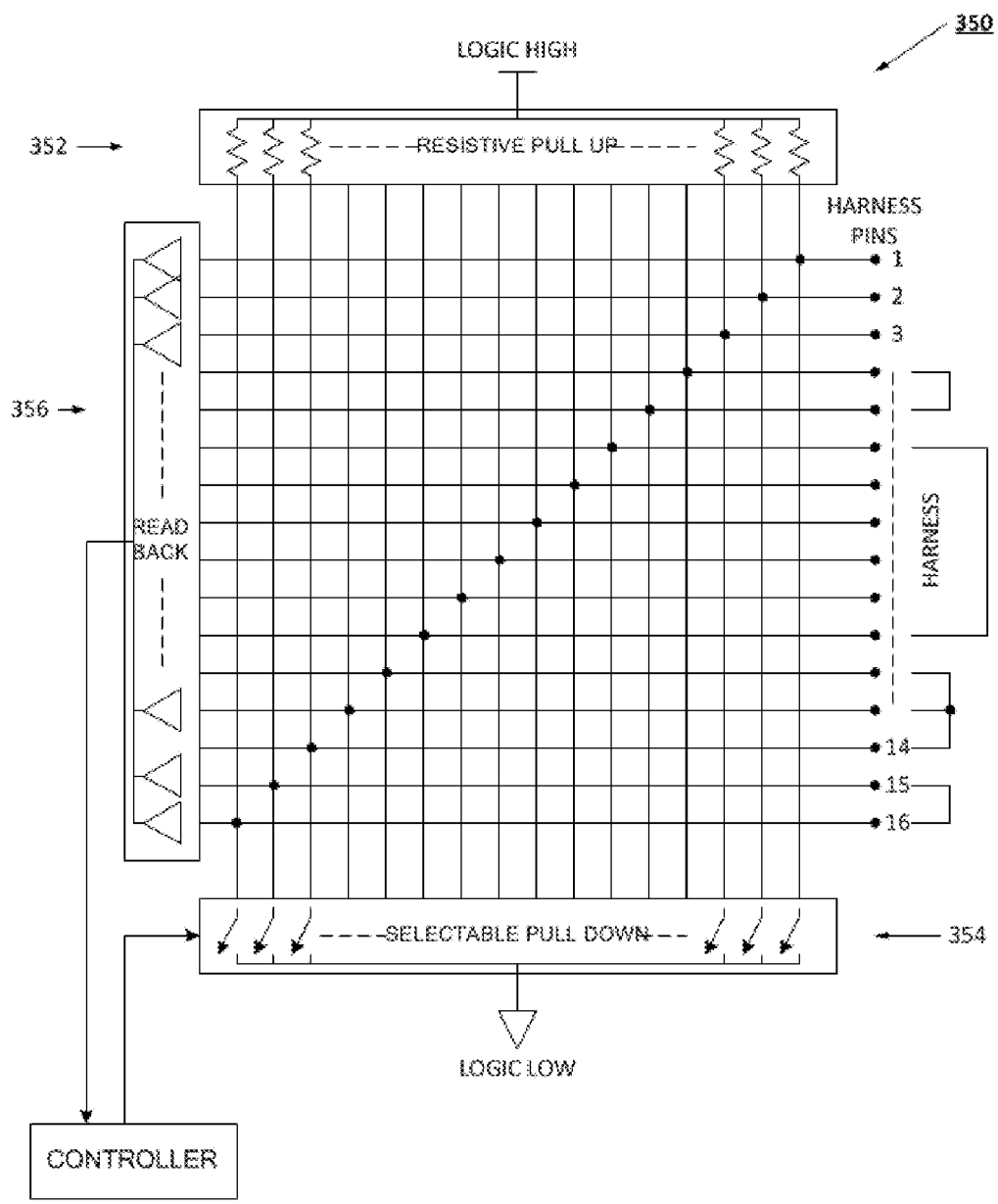
FIG. 7 is a block diagram of a continuity testing circuit portion for use with a harness tester in accord with the present invention.

Referring to FIG. 7, a continuity subsystem 350 is shown to comprise three basic sections: resistive pull up 352, selectable pull down 354, and read back 356. More particularly, subsystem 350 is illustrated with a 16 pin harness, which may be, for example, a harness with 8 lines, each line having a first end connector and a second end connector for a total of 16 pins. The technique described can be expanded to any number of pins. The resistive pull up block 352 pulls every harness pin up to a high, or logic "1" level. The selectable pull down 354 is under control of the module controller, which selectively pulls an individual pin down to a low, or logic "0" level. The controller then reads the logic level (high=1, low=0) of the entire set of harness pins via the read back block 356.

To determine continuity, the controller sets a single pin to the low condition, while leaving every other pin to the high state. The entire set of pin levels is then read and stored. The process is repeated a pin at a time until every pin has been made low. The set of results produces a matrix of read back data that fully describes the harness continuity. The read back data matrix for the illustrated 16 pin connector harness generates a 16×16 matrix of data.

FIG. 8 shows hypothetical results 375 for the harness setup of FIG. 7. The illustrated pattern of logic one's and zero's describes the continuity of the wiring harness. As shown, there is only one zero in rows 1-3, 7-10 indicating that these pins are not connected. Rows 4-6, 11, 15, and 16 each contain two zeros indicating that these pins each connect to one other harness pin. Rows 12-14 each contain three zeros indicating that these pins each connect to two other harness pins. It will be understood that other continuity processes may be used consistent with this disclosure.

Figure 9:
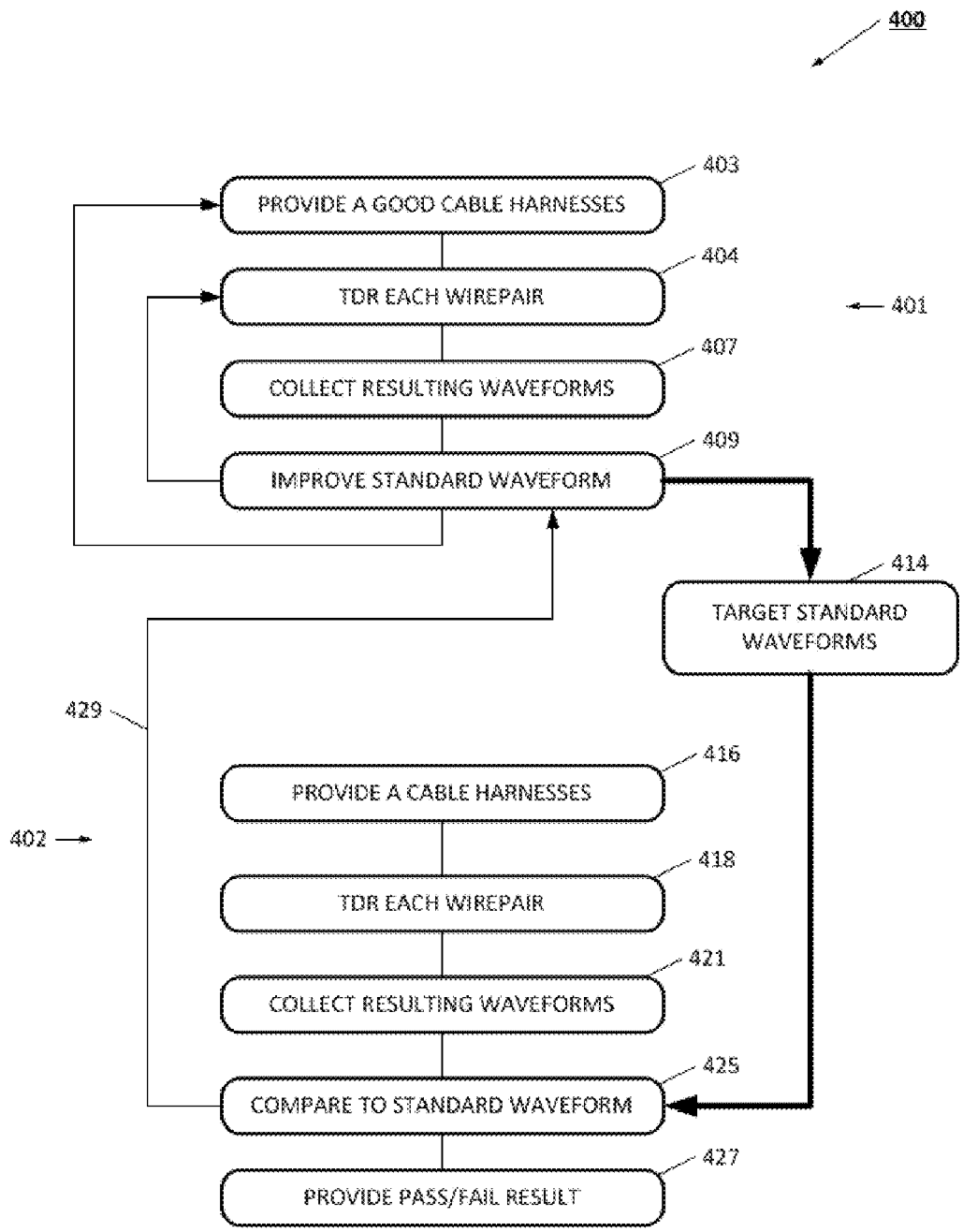
FIG. 9 is a flowchart of an analysis process for evaluating TDR waveforms operating on a harness tester in accord with the present invention.

Referring now to FIG. 9, a method 400 for analyzing a large set of TDR waveforms is illustrated. In many cases, method 400 can be used to quickly and efficiently perform an analysis on the results from a TDR testing device, with a level of accuracy never seen before. The accuracy and speed is so exceptional that a cost effective tester is enabled that can find latent defects in complex cable harnesses that has not been possible before.

Process 400 has a setup portion 401 and a production portion 402. Generally, setup phase 401 is used to evaluate and characterize known good cable harnesses to establish test limits for standard waveforms that completely and accurately define the impedance characteristics versus time (and calculated distance based on NVP) of every tested wire pair. It will be understood that the number of harnesses that need to be tested to establish a sufficiently accurate standard waveform, and acceptable tolerances, is dependent on many factors. However, it will be appreciated that generally the quality and accuracy of the standard waveform improves with the number of good harnesses tested and consolidated into the standard.

The process of obtaining a statistically significant number of known good harnesses to derive a representative standard waveform as the basis for setting test limits can be expensive because of high labor and material costs. As an alternative, mathematical modeling of electrical components is a known design technique that can be used to generate initial standard waveforms. Mathematical modeling of wire, terminal and connector combinations for TDR measurement will be developed to generate the standard waveforms used for setting the test limits. The initial models will be validated against measured known good harnesses over time to improve the model as necessary. Once the standard models are consistent with the measured results, the modeling method of generating the standard waveform and test limits may be the preferred method. The characterization of standard waveforms is the basis for allowing test limits to be generated by modeling and calculation for future harnesses.

For setup 402, a known good harness is placed into the tester as shown in block 403, such as tester 300 discussed with reference to FIG. 5. Each wire pair is stimulated by the TDR as shown in block 404, and the resulting time/impedance waveform is collected as shown in block 407. The current results waveform is used to improve the standard waveform, as shown in block 409. For example, a known good waveform may have a wire pair that is out of tolerance to the current standard waveform. In response, the standard waveform may have its test limits modified to reflect the new data point. If several good harnesses show a similar pattern, then such a modification of the test limits can be made confidently. Accordingly, over time, the test limits 414 will adjust to reflect measured results.

In one example, the waveform may be evaluated at a constant vertical and horizontal resolution. In some cases, however, it may be useful to evaluate one or more portions at higher resolution to reveal more subtle impedance discrepancies. For example, at known problem portions, such as at splices or at the crimp joints, such increased resolution may advantageously identify more subtle latent defects.

Once a library of measured or calculated standard waveforms 414 is available, the test limits can be defined and production testing 402 can be used to pass or fail harness assemblies. As described earlier, a cable harness is provided 416 that is physically attached to a harness jig, and electrically connected to the testing circuitry. Each wire pair has a TDR stimulation signal applied 418, and the resulting time/impedance waveform is collected 421. For each wire pair, the resulting waveform is compared 425 to the standard waveform test limits retrieved from the library 414. A simple comparison can be made to see if the measured result waveform is within the test limits defined for the standard waveform. According, a pass/fail indication 427 can be made efficiently. Data collected from the production test portion 402 can also be used to make adjustments in the standard waveform test limits, as shown by line 429.

Test process 400 is able to detect several different types of defects or faults in the wires of the cable harness, many of which are latent defects. A latent defect is a cable or wire abnormality that allows the cable or wire to perform its intended function for a period of time. But, at some later time, due usually to some environmental condition such as vibration, shock, or temperature, the latent defect causes a failure in the wire or cable. Some of the defects that process 400 detects are listed below.

A short. A short is where two or more wires are electrically shorted or improperly connected together. Shorts are usually caused by damage to the insulation of a wire or uncrimped (loose) wire strands that are in contact with another wire, a wire shield or a conductive surface.

An open. An open is where a wire has a complete discontinuity in the conductor which does not allow electrical current to flow. Opens are typically caused by a broken or severed wire. An open can also be caused by crimping a terminal over the insulation of the wire rather than crimping directly to the core conductor(s).

Insulation chafing. Chafing is usually caused by two or more wires rubbing together, rubbing against an adjacent surface or being abraded in the machinery that is used to attach the terminals to the wire which damages the wire's insulation and may cause a short immediately or over time.

Wire over-twisting. Individual wires carrying sensitive signals are sometimes twisted together to reduce EMI radiation and susceptibility. During the twisting process the wires can kink or for other reasons not twist uniformly over the wire pair length. The result is over twisting where the twist becomes so tight that the wire's core is pulled through the wire's insulation, which may cause a short immediately or over time.

Wire over-stretching. If a wire is physically too short to reach between the connector bodies a tension may be applied to the wire. This tension can over-stretch the cable which reduces the cross section of the wire and thins the protective insulation. In a twisted wire pair, this can also cause under twisting which reduces the EMI protection provided by the twisting. This may lead to wires that over time will fail or may corrupt communications due to interference from adjacent circuits.

A pinch. A pinch is a severe bend or bends in a wire that is typically accompanied with an external force to permanently deform the wire. The pinch may damage the wire's insulation and also fracture or even severe one or more wire strands. This damage may cause an immediate failure or one can develop over time.

Severed strands. Wires can be fabricated with a single conductive core or two or more conductive cores. Multicore or stranded wires are typically used where flexibility is a major consideration. Severed strands can happen as a result of chafing, over twisting, over stretching, pinching or other physical stress. Severed strands reduce the effective cross section of a wire causing the electrical current to flow through a higher resistance. This can cause the wire to get hotter at the point of the severed strand(s) and potentially ignite adjacent flammable materials. Also, the reduced current carrying ability of the wire may not meet the power requirements of the connected device causing it to malfunction. A wire with some severed strands will always pass typical continuity testing as this does not test the wire with a high current. The defect may function normally for a period of time but can cause an equipment malfunction or even a fire eventually.

Figure 10:
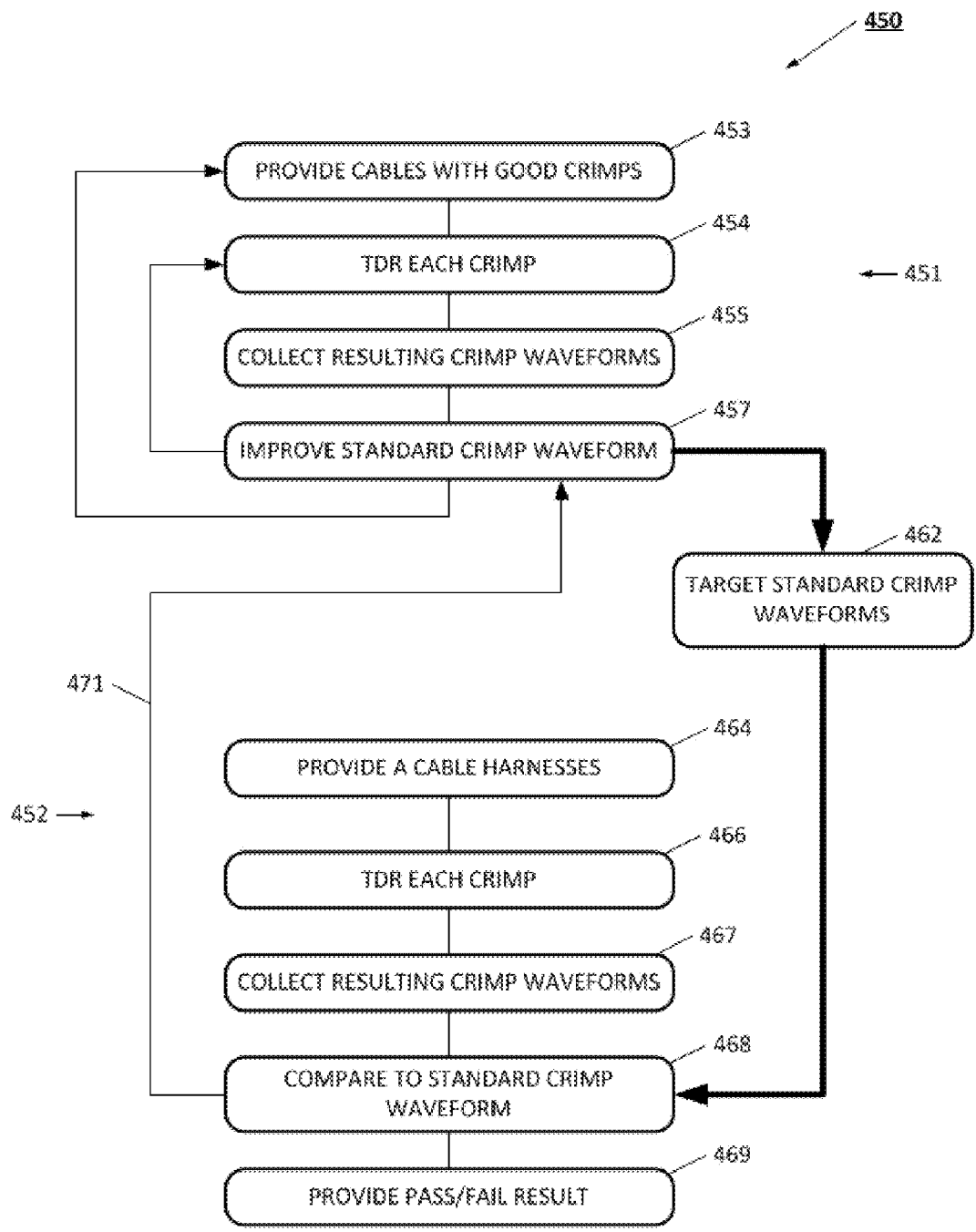
FIG. 10 is a flowchart of an analysis process for evaluating TDR waveforms operating on a harness tester in accord with the present invention.

Referring now to FIG. 10, a method 450 for analyzing a large set of TDR waveforms is illustrated. In particular, method 450 applies to portions of a cable where increased scrutiny is useful, for example, at crimp points. Although method 450 is described with reference to crimp points, it will be understood that the method can apply to other cable portions having a heightened interest. In many cases, method 450 can be used to quickly and efficiently perform an analysis on the results from a TDR device, with a level of accuracy never seen before. The accuracy and speed is so exceptional that a cost effective tester is enabled that can find latent defects or minor abnormalities in crimp joints that has not been possible before.

Process 450 has a setup portion 451 and a production portion 452. Generally, setup phase 451 is used to evaluate and characterize known good crimps, including crimp portions from known good cable harnesses. Also, additional crimp waveform data may be available from other test sources, other TDR evaluation of the crimps, or from the providers of the crimp devices or tools. The known good crimp waveform data is used to establish a set of standard waveforms that completely and accurately define the impedance characteristics of every crimp in a wire harness and provide the basis for setting test limits. It will be understood that the number of crimps that need to be tested to establish a sufficiently accurate standard waveform, and acceptable test limits, is dependent on many factors. However, it will be appreciated that generally the quality and accuracy of the standard waveform improves with the number of good crimps tested and consolidated into the standard. As described earlier with reference to the standard waveforms generated in setup 401 in process 400, standard waveforms and test limits may be mathematically modeled. The initial models will be validated against measured known good crimp joints over time to improve the model as necessary. Once the standard models are consistent with the measured results, the modeling method of generating the standard waveform and test limits may be the preferred method.

For setup 451, a known good harness or crimp portion is placed into the tester as shown in block 453, such as tester 300 discussed with reference to FIG. 5. Each wire pair is stimulated by the TDR as shown in block 454, and the resulting time/impedance waveform is collected as shown in block 455. The current results waveform is used to improve the standard waveform, as shown in block 457. For example, a known good crimp waveform may have a crimp joint that is out of tolerance to the current standard waveform. In response, the standard waveform may have its tolerance modified to reflect the new data point. If several good crimp joints show a similar pattern, then such a modification of the standard can be made confidently. Accordingly, over time, the standard waveform test limits 462 will adjust to reflect measured results. The characterization of standard waveforms is also the basis for allowing test limits to be generated by modeling and calculation for wire pairs with similar properties.

It may be useful to evaluate the crimp joint portion at higher resolution than used in other lengths of the wire to reveal more subtle impedance discrepancies. Such increased resolution may advantageously identify more subtle latent defects. By accurately defining the standard crimp waveform, and by conservatively setting the test limits, several latent defects can be readily identified. For example, it is possible to identify under crimping, over crimping, insufficient crimp length, missing strands, insulation in the crimp, improper crimps and air gaps. None of these are revealed under prior testing procedures, and very often led to intermittent electrical failures after the product was in the hands of the consumer.

Once a good library of standard crimp waveform test limits 462 is available, the production testing 452 can be used. As described earlier, a cable harness is provided 464 that is physically attached to a harness jig, and electrically connected to the testing circuitry. Each wire pair has a TDR stimulation signal applied 466, and the resulting high-resolution time/impedance waveform is collected 467. For each wire pair, the resulting waveform is compared 468 to the standard waveform test limits retrieved from the standard waveform test limit library 462. A simple comparison can be made to see if the measured result waveform is within the test limits defined in the standard waveform. According, a pass/fail indication 469 can be made efficiently. Data collected from the production test portion 452 can also be used to make adjustments in the standard waveform test limits, as shown by line 471.

Test process 450 is able to detect several different types of defects or faults in crimp joints at the connector terminal ends of the cable harness, many of which are latent defects. A latent defect is a crimp or wire abnormality that allows the cable or wire to perform its intended function for a period of time. But, at some later time, due usually to some environmental condition such as vibration, shock, or temperature, the latent defect causes a failure in the wire or cable. Some of the defects that process 450 detects are listed below.

- An air gap. An air gap is where the terminal is under crimped and the terminal material does not completely contact the wire core. An air gap leaves a space between the terminal and the conductors that can become contaminated with debris or moisture. Some contaminants will act as an insulator reducing the capabilities of the wire and moisture will cause corrosion. In either case, the wire will eventually cause intermittent or complete circuit failure.
- Under-crimping. Under crimping is caused by insufficient crimp force applied when attaching the terminal to a wire or the wrong crimp die is used to crimp the terminal. This leads to a loose connection with similar failures as the air gap.
- Over-crimping. Over crimping is caused by excessive force applied when attaching the terminal to a wire or the wrong crimping die is used to crimp the terminal. Strands can be deformed or broken, or the crimp metal can be fatigued and will degrade and eventually fail.
- Missing strands. Stripping the insulation from the end of the wire is required for attaching the terminal. Missing strands can occur when the wire insulation is stripped by a machine or by hand and one or more of the wire's strands are severed along with the insulation. Similar to severed strands in the harness, missing strands reduce the effective cross section of a wire causing the electrical current to flow through a higher resistance. This can cause the terminal to get hotter at the point of the missing strand(s) and potentially ignite adjacent flammable materials. Also, the reduced current carrying ability of the wire may not meet the power requirements of the connected device causing it to malfunction. A terminal with only some of the strands missing will always pass typical continuity testing as this does not test the wire with a high current. The defect many function normally for a long period of time but can cause an equipment malfunction or even a fire eventually.
- Insulation in the crimp. Insulation in the crimp is the result of either under stripping the wire's insulation or inserting the wire too far into the terminal before crimping.

Although there may be an initial connection, the circuit eventually fails. Standard continuity tests will not identify this defect.

No core in crimp. No core in the crimp happens when an un-stripped wire is crimped into a terminal. This defect will show as an open at the terminal.

Insufficient crimp length. Insufficient crimp length can occur when the wrong crimp die is used or the terminal is improperly inserted into the terminal prior to crimping.

Miscrimps. The Society of Automotive Engineers has standards defining the requirements for good wiring crimps and definitions for numerous types of improper or bad crimps. These miscrimps are included by reference to the types of defects that the disclosed processes and test systems can detect.

Figure 11:
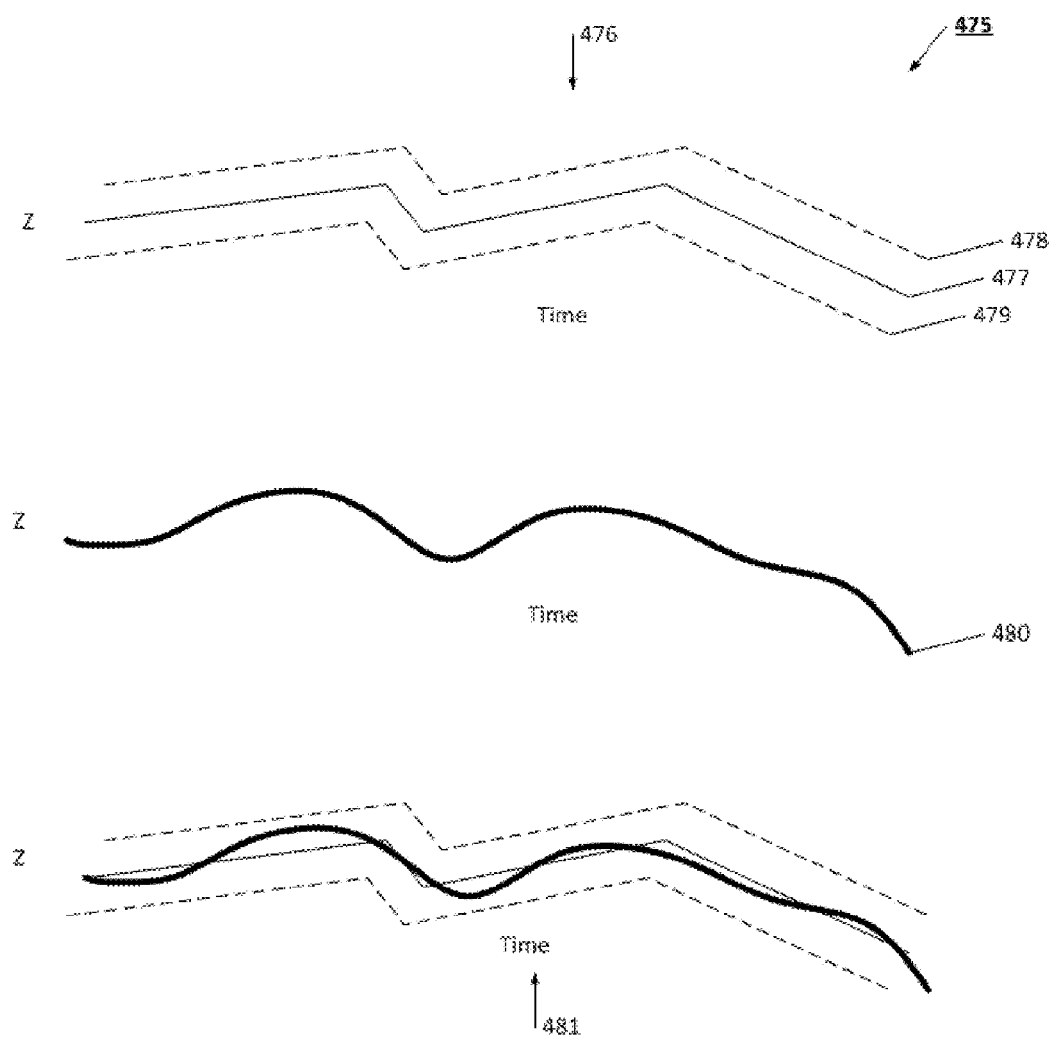
FIG. 11 shows examples of standard target waveforms for use in evaluating TDR waveforms collected on a harness tester in accord with the present invention.

Referring now to FIG. 11, waveforms 475 used in the comparison process are described. A standard waveform, such as standard waveform 476, is generated for every wire pair that will be evaluated in the cable harness. It will be understood that the standard may be modeled from measurements of known good harnesses, from mathematical modeling, or a combination of both. Typically the set of wire pairs will include every wire in the cable harness, although it is contemplated that circumstances could arise where it is too difficult or not possible to test every wire.

After testing a number of known good cable harnesses, good quality standard waveforms can be derived for each tested wire pair. Although other ways of generating a standard waveform may be used, the standard waveform 476 has a line 477 that relates to the average of the many good tests that were run. From the average line 477, and upper tolerance 478 and lower tolerance 479 can be established. These limit lines can be consistently spaced over the full time of the waveform, or may have portions with tighter or looser tolerances. In one example, the limit lines are calculated to be 3 standard deviations above and below the average line 477. It will be appreciated that there are many other ways to set the tolerance lines, and may include automated and manual inputs.

For every tested wire pair, a resulting TDR waveform 480 is collected. The resulting waveform 480 can then be compared to the standard TDR waveform test limits 476 for that respective cable pair. Comparison 481 shows that resulting waveform 480 was within the quality limits defined in the standard TDR waveform test limits 476. Accordingly, comparison 481 represents a good characterization of the wire pair. Although the comparison illustrated in FIG. 11 was done in the time domain, it will be understood that the comparison can also be done in the frequency domain or a combination of both time and frequency domains.

Figure 12:
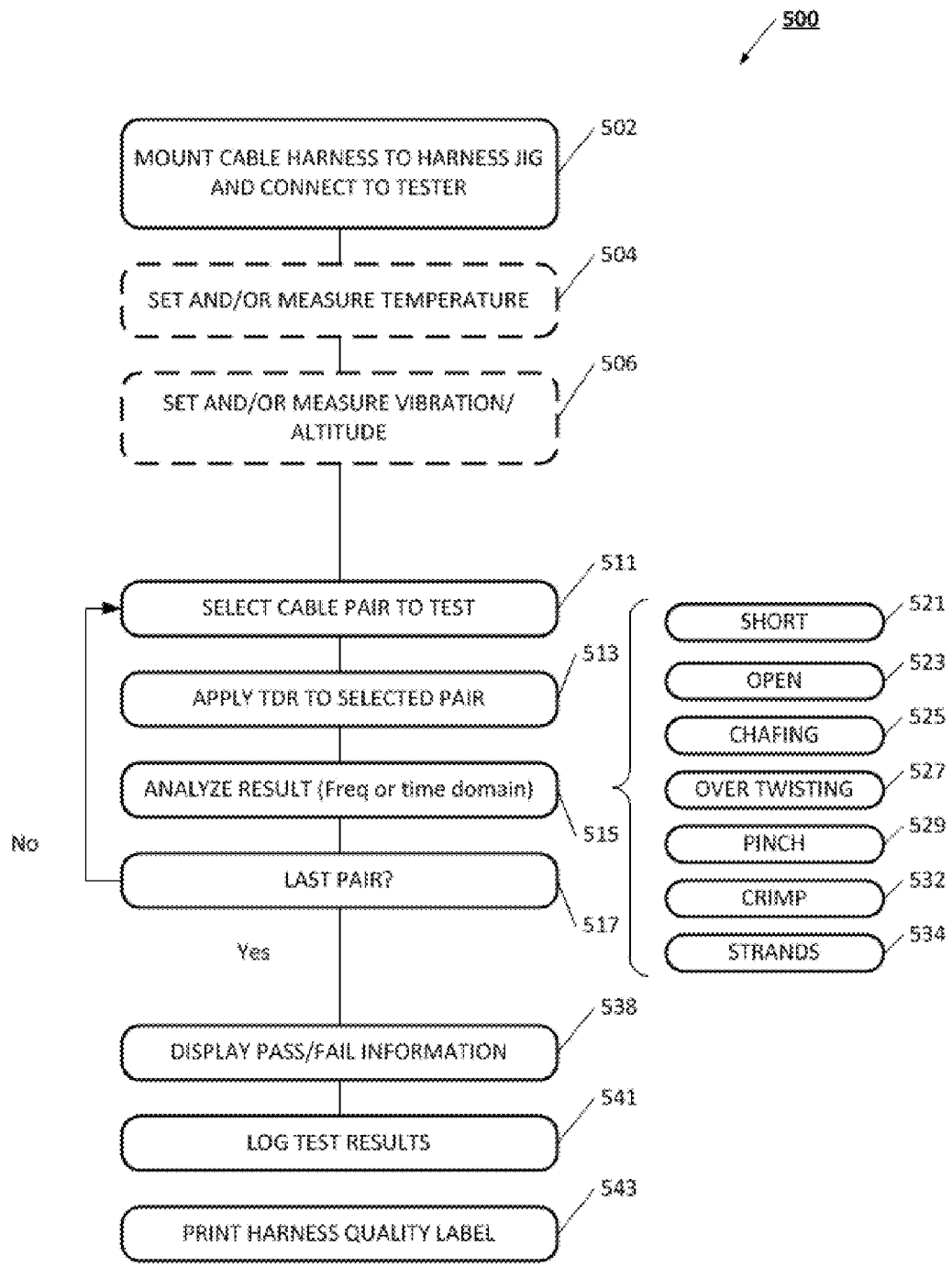
FIG. 12 is a flowchart of an analysis process operating on a harness tester in accord with the present invention.

Referring now to FIG. 12, a process 500 for testing a cable harness is illustrated. Process 500 may operate, for example, on a harness tester such as tester 300 described with reference to FIG. 5. In block 502, a cable harness is attached to a harness jig. Typically, the cable harness has a set of connectors that couple to cooperating connectors on the jig, which are in turn coupled to the testing circuitry. In one example, body holders are mounted on the harness jig to receive and couple to the mating connectors of the harness. Typically, every connector from the harness has a complimentary connector on the jig so that every pin from the harness is electrically connected to the test circuitry.

As shown in block 504, the test process may measure the temperature of the cable harness. Since some metals, crimps, and connectors act differently at different temperatures, measuring and using the actual temperature of the cable enables a more accurate assessment of quality. In another example, the cable harness may be set to a specific temperature, or cycle through a range of temperatures, in order to stress the cable. In this way, additional or latent defects may be identified. In another example of environmental stress, the jig and cable harness may be made to vibrate 506, either at a steady pace, or may be cycled through various speeds and amplitudes, and or may be cycled through various atmospheric pressures. In another example, the jig and cable harness are subjected to one or more shock impacts. Again, testing with stress inducing environmental conditions may identify additional or latent defects.

Process 500 then proceeds to select a particular wire pair 511. With the flexibility of the switch, it is easier to select the best wire pairs for testing. Typically, it is desirable that the wires have a known and close physical relationship for the greatest length possible. For example, a twisted pair is ideal. In other cases, two wires may have a defined physical arrangement for a portion of the entire length, such as when a wire splices or Y's in the cable bundle. Once a pair is selected as shown in block 511, the TDR engine stimulates the pair and receives and records the resulting waveform as shown in block 513. The resulting waveform is typically in the time domain, which has time (or distance) on the X axis, with a impedance on the Y axis. To improve accuracy and the quality assessment, a higher resolution, such as 16 bits, should be used on the vertical axis, and the horizontal axis should have a high timing resolution, such as 50 picoseconds. It will be appreciated that more or less resolution can be used depending on application specific requirements.

The resulting waveform can them be analyzed as shown in block 515. The results can be analyzed as the results come in from each pair, or alternatively, the analysis may be done at a later time, for example, after all pair waveforms have been collected and stored. Also, the analysis may be done in the time domain, the frequency domain, or in both.

Generally, process 500 is used to identify a short condition 521 or an open condition 523. With sufficient resolution and prior understanding of the cable harness, it is also possible to identify areas of chafing 525, that is, where insulation has been worn thin, but has not yet resulted in an open or short condition. It is also possible to identify over-twisting 527 or over-stretching of a wire. Again, these conditions may show no indication of an open or short, but the small impedance discrepancies from expected values can identify these latent manufacture defects, which are likely to caused faults or defects at a later time. In a similar manner, the system may detect a pinched 529 wire, or a wire that has only some of its strands broken 534 or wires that are looped back because of excess length. In a particular difficult problem, process 500 is able to detect abnormalities in a crimp joint 532, such as over crimping, under crimping, an air gap, or insufficient crimp length. Many of these defects identified by process 500 would normally go undetected, but with process 500, these problems, which are likely to cause latent failure, may be quickly identified before the harness is installed.

The TDR process 511-515 is repeated until all wire pairs have been tested, as shown in block 517. The test results can then be displayed to the operator as shown in block 538, and the test results logged 541 for future quality analysis and warranty assessments. If a printer is used, then a tag or label may be printed 543 for attachment to the cable or its documentation, which sets out the particular test results. It will be appreciated that the label or tag could include as much or little information as needed by the specific application.

Figure 13:
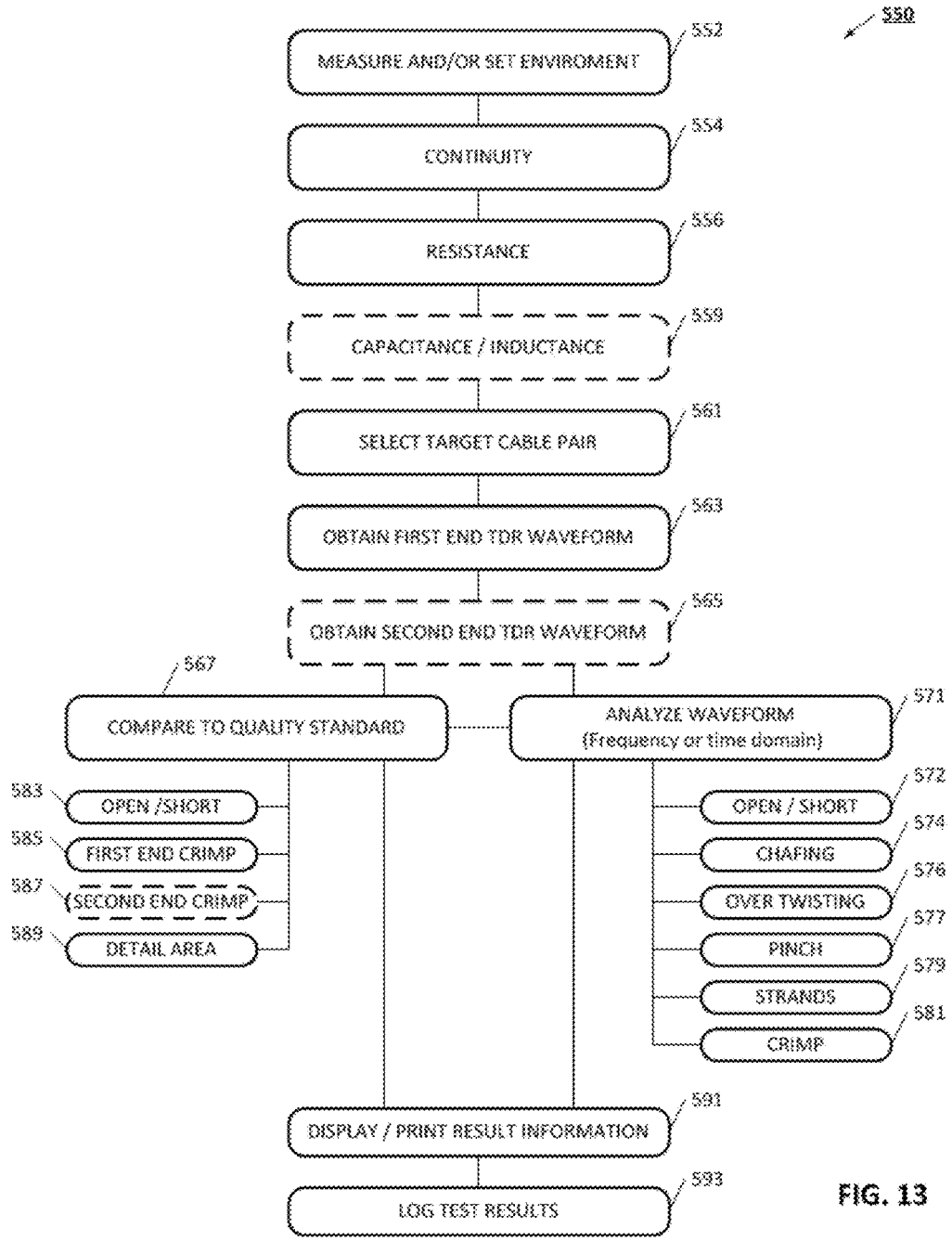
FIG. 13 is a flowchart of an analysis process operating on a harness tester in accord with the present invention.

Referring now to FIG. 13, another test process 550 is illustrated. As with test process 500, a cable harness is electrically connected to a test system. As described previously, process 550 may measure or set environmental conditions, such as temperature, vibration, atmospheric pressure, or shock, as shown in block 552. Process 550 then proceeds to do continuity test 554 on the entire cable harness. An example continuity test was described with reference to FIG. 7 and FIG. 8. Generally, every pin in every harness connector is taken high, and then one at a time, each pin is taken low. For each pin, the resulting pin status is read and stored. After every pin has been individually taken low, a matrix of data is generated that represents the continuity signature for the harness. The measured signature is compared to the expected signature, and continuity can be confirmed. Such a complete continuity test is able to find any instance of wrong wiring, or the presence of cable strands shorting between crimps. In this way, there is complete confidence that the wire routing was done properly, which is a huge consideration in a harness with hundreds of wires and connections.

As illustrated in block 556, a resistance test can them be performed on each wire. A known current is applied to each wire, and the voltage drop measured end-to-end. From this the resistance is calculated, and compared to an expected value. Deviation from the expected value can indicated that the wrong material or gauge of wire was used, for example. As shown in block 559, an inductance or capacitance test can be done. As with resistance, the measured results can be compared to the expected values. Deviation from the expectation can indicate that a twisted pair has too many or too few twists, that the wrong gauge or material wire or wire insulation was used, for example.

In block 561, line pairs are selected and switched to connect to the TDR engine. The pair is stimulated from a first end, and the resulting waveform captured 563. To increase resolution, or as a further check on results, the switch may be set so that the pair may be stimulated from the other end, and the resulting waveform captured as shown in block 565. One or both of the waveforms are then analyzed for each wire pair.

As shown in block 567, one way to analyze the waveforms is to compare the measured waveforms to a known good standard. Typically, the standard is developed over time by measuring and analyzing a large number of known good cable harnesses. It will be understood that the standard may be modeled from measurements of known good harnesses, from mathematical modeling, or a combination of both. Not only is the basic shape of the standard waveform thereby defined, but allowable tolerances can be defined for the standard by which an out-of-tolerance result may be identified. In some cases, a single tolerance may be applied to the entire standard waveform, but often different portions of the waveform may have tighter or looser tolerances. By way of example, the crimps that attach the connector to each metal electrical line are known to be particularly prone to latent defects. Accordingly, the portions of the cable, which represent the very ends of the cable, are likely to have the tightest tolerances for rejection. In a similar manner, a portion of a cable that has a splice or Y may also require a tighter tolerance. In contrast, a long run of a cable with no joints or complications may enjoy a wide tolerance band. Also, the type of defect that is being looked for may affect the required tolerance. For example, an outright short or open condition is relatively east to locate, and therefore can be accurately assessed, even with a wide tolerance to the standard waveform.

As illustrated in block 583, the resulting waveforms may be compared to the known standard test limits to identify opens and shorts 583. In a similar manner, but requiring tighter test limits, deviation from the standard waveform test limits may indicate something less than an all-out short or open, such as the presence of chafing, a pinch, over-twisting or stretching, or a few broken strands. With the sensitivity to crimp quality, the crimps may have their own detailed standard waveform test limits. The measured crimp waveforms may be compared to the standard crimp waveform test limits, and the quality of the crimp assessed, as shown in block 585. In some cable arrangements, it may be advantageous to have two readings for a crimp, that is, a crimp result waveform taken from both ends of the cable, as shown in block 587. In this way, the best crimp result may be selected and used to compare to the standard test limits, or both can be used as a check or confirmation of results. Besides the crimp area, other detail portions of the cable may be selected for heightened scrutiny, as shown in block 589.

As illustrated in block 571, algorithmic processes may be applied to the resultant waveform data. This can be done in the time domain, the frequency domain, or in both. Even though the waveform comparison of block 567 may be faster and more efficient, it may be advantageous to do these algorithmic processes when insufficient historical data is available to have robust standard waveforms test limits, or when additional information would be useful on the particulars of a defect. For example, a cable harness may fail the waveform comparison of block 567, and the algorithmic processes of block 571 may be used to provide additional detail or trouble shooting information. Further, data measured in the algorithmic processes 571 may be reported to the waveform comparison process 567 to improve or modify the standard waveform.

As described earlier, the resulting waveforms can be analyzed to identify opens or shorts 572, insulation chafing or thinning 574, over-twisting 576 or over-stretching, pinching 577, broken strands 579, or improper crimps 581. The quality data may be printed for labels or tags, and pass/fail indication given to operators, as shown in block 591. Also, the resulting waveform data and algorithmic results can be saved 593, which is useful for improving future standard waveforms, as well as for assessing warranty, manufacturing, and quality.

While particular preferred and alternative embodiments of the present intention have been disclosed, it will be appreciated that many various modifications and extensions of the above described technology may be implemented using the teaching of this invention. All such modifications and extensions are intended to be included within the true spirit and scope of the appended claims.

What is claimed is:

1. A tester for characterizing an electric cable harness, comprising:
   a switch system connected to every connector pin on the electric cable harness;
   a Time Domain Reflectometer (TDR) engine connected to the switch system; and
   a controller connected to the TDR engine and the switch system, operating the steps of:
   (a) configuring the switch system to couple the TDR engine to a new wire pair;
   (b) having the TDR engine provide a TDR stimulus to the new wire pair and collecting its resulting TDR waveform data;
   repeating steps (a) and (b) until substantially all wire pairs in the harness have had their resulting TDR waveform data collected;
   analyzing the collected TDR waveform data;
   reporting results from the analysis;
   a plurality of TDR engines connected to a switch system or systems; and
   wherein the controller further operates the step of configuring the switch system(s) to couple each of the TDR engines to a different set of wire pairs so that TDR waveforms can be collected from a plurality of wire pairs in parallel.

2. The tester according to claim 1, further comprising a harness jig for mounting the electric cable harness, the harness jig having connectors for mating with each connector on the electric cable harness.

3. The tester according to claim 2, wherein the connectors on the harness jig are connector body holders having pogo pins.

4. The tester according to claim 2, further including a device to apply vibration, apply shock, apply shaking, altitude, or set a temperature to the electric cable harness.

5. The tester according to claim 1, further including user input devices, a display, or a printer.

6. The tester according to claim 1, wherein in the controller further operates the steps of:
retrieving test limits for a particular wire pair;
comparing the resulting waveform data from the particular wire pair to the standard waveform test limits to make a pass or fail determination; and
the reporting step includes displaying or printing a pass or fail indication based on the results of the comparison.

7. The tester according to claim 1, wherein the controller operates the analyzing step includes using a measured temperature of the electric cable harness.

8. The tester according to claim 1, further comprising electric circuitry for performing a continuity test, a resistance test, an inductance test, or a capacitance test on wires in the electric cable harness.

9. The tester according to claim 1, wherein the switch system comprises solid state switches or mechanical switches.

10. A method of testing an electric cable harness, comprising:
providing a plurality TDR engines connected to a switch system device;
mounting a cable harness to a jig and connecting the cables in the harness to the switch system device;
selecting a plurality of wire pairs in the harness to test;
applying, using more than one TDR engine, a respective TDR signal to each selected wire pair and collecting responsive TDR waveform data;
repeating the selecting and applying steps until all wire pairs have been tested;
comparing the responsive TDR waveforms to respective test limits for each wire pair; and
determining if the cable harness meets quality standards.

11. The method according to claim 10, further including the step of setting an environmental condition or measuring an environmental condition.

12. The method according to claim 10, further including the step of evaluating the resulting TDR waveforms to identify a cable defect from a list consisting of: a short, an open, insulation chafing, wire over-twisting, wire over-stretching, a pinch, and severed strands.

13. The method according to claim 10, further including the step of evaluating the resulting TDR waveforms to identify a crimp defect from a list consisting of: an air gap, under-crimping, over-crimping, missing strands, insulation in the crimp, no core in crimp and insufficient crimp length.

14. The method according to claim 10, wherein the comparing step is done in the frequency domain.

15. The method according to claim 10, further including running a continuity test on substantially all the connector pins in the cable harness.

16. The method according to claim 10, further including running a resistance test, an inductance test, or a capacitance test on wires in the cable harness.

17. The method according to claim 10, further including applying a TDR signal from the other terminal end of the selected wire pairs and obtaining a second resulting TDR waveform, and using the second TDR waveform to evaluate crimp quality.

18. A tester for characterizing an electric cable harness, comprising:
a switch system connected to every connector pin on the electric cable harness;
a set of TDR engine modules connected to the switch system, each TDR engine module having circuitry to operate a Time Domain Reflectometer test;
a memory holding a library of standard TDR waveform test limits for each wire pair; and
a controller connected to the TDR engine and the switch system, operating the steps of:
(a) configuring the switch system to couple the TDR circuits to different wire pairs;
(b) having the TDR circuits provide a TDR stimulus to their respective wire pair and collecting their resulting TDR waveforms;
repeating steps (a) and (b) until substantially all wire pairs in the cable harness have had their resulting TDR waveform collected;
analyzing the collected TDR waveforms; and
reporting results from the analysis.

19. The tester according to claim 18, further including testing circuitry on each TDR engine card for a continuity test, a resistance test, an inductance test, or a capacitance test.

* * * * *